United States Patent
Okuyama et al.

(10) Patent No.: US 6,305,949 B1
(45) Date of Patent: Oct. 23, 2001

(54) PRESS-FIT PIN, CONNECTOR AND PRINTED CIRCUIT BOARD-CONNECTED STRUCTURE

(75) Inventors: Takeshi Okuyama; Akira Okada; Hideo Miyazawa; Manabu Shimizu; Atsushi Sakurai, all of Tokyo (JP)

(73) Assignee: Fujitsu Takamisawa Component Limited, Tokyo (JP)

( * ) Notice: Subject to any disclaimer, the term of this patent is extended or adjusted under 35 U.S.C. 154(b) by 0 days.

(21) Appl. No.: 09/437,475

(22) Filed: Nov. 10, 1999

(30) Foreign Application Priority Data

Mar. 8, 1999 (JP) .................................................. 11-060263

(51) Int. Cl.[7] ..................................................... H01R 9/09
(52) U.S. Cl. ............................................................... 439/75
(58) Field of Search .................................. 439/45, 48, 75, 439/78, 733.1

(56) References Cited

U.S. PATENT DOCUMENTS

| | | | |
|---|---|---|---|
| 2,752,580 | * 6/1956 | Shewmaker | 439/75 |
| 3,400,358 | * 9/1968 | Byrnes et al. | 439/75 |
| 4,446,505 | * 5/1984 | Long et al. | 361/413 |
| 4,533,200 | * 8/1985 | Wilson | 439/395 |
| 5,014,419 | * 5/1991 | Cray et al. | 29/830 |
| 5,715,595 | * 2/1998 | Kman et al. | 29/845 |
| 5,761,050 | * 6/1998 | Archer | 361/791 |
| 5,980,271 | * 11/1999 | MacDougall et al. | 439/78 |

* cited by examiner

Primary Examiner—Brian Sircus
Assistant Examiner—Thanh-Tam Le
(74) Attorney, Agent, or Firm—Staas & Halsey LLP

(57) ABSTRACT

A press-fit pin for use with a printed circuit board assembly consisting of two opposed printed circuit boards, the press-fit pin having an upper first press-fit section and a lower second press-fit section. The first press-fit section and the second press-fit section are disposed so that the first press-fit section enters the first through-hole in the first printed circuit board before the second press-fit section enters the second through-hole in the second printed circuit board. As a result, the peaks of the forces required to press the first press-fit section and second press-fit section into place are staggered and do not coincide, resulting in a reduction in peak total force required and thus reducing the danger of bending the press-fit pin during insertion in the printed circuit boards.

40 Claims, 17 Drawing Sheets

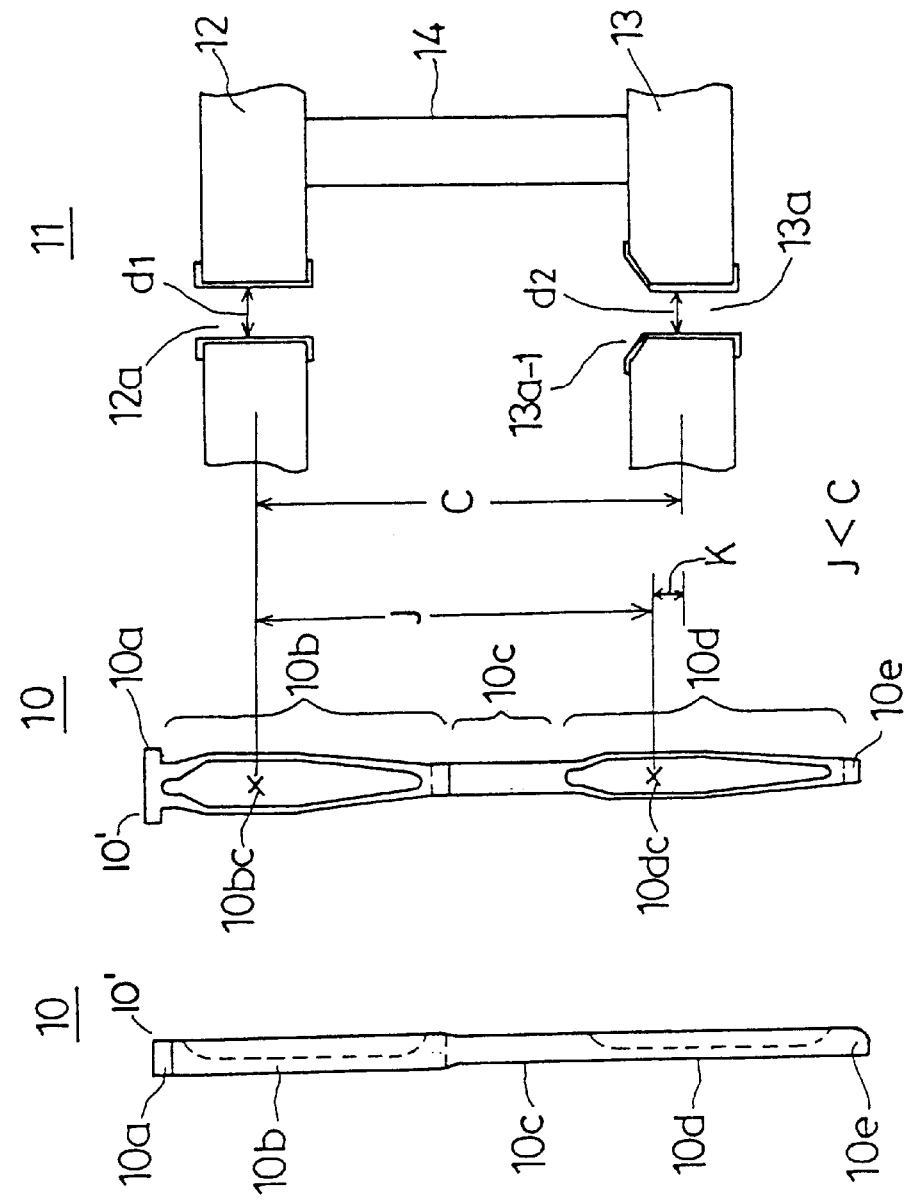

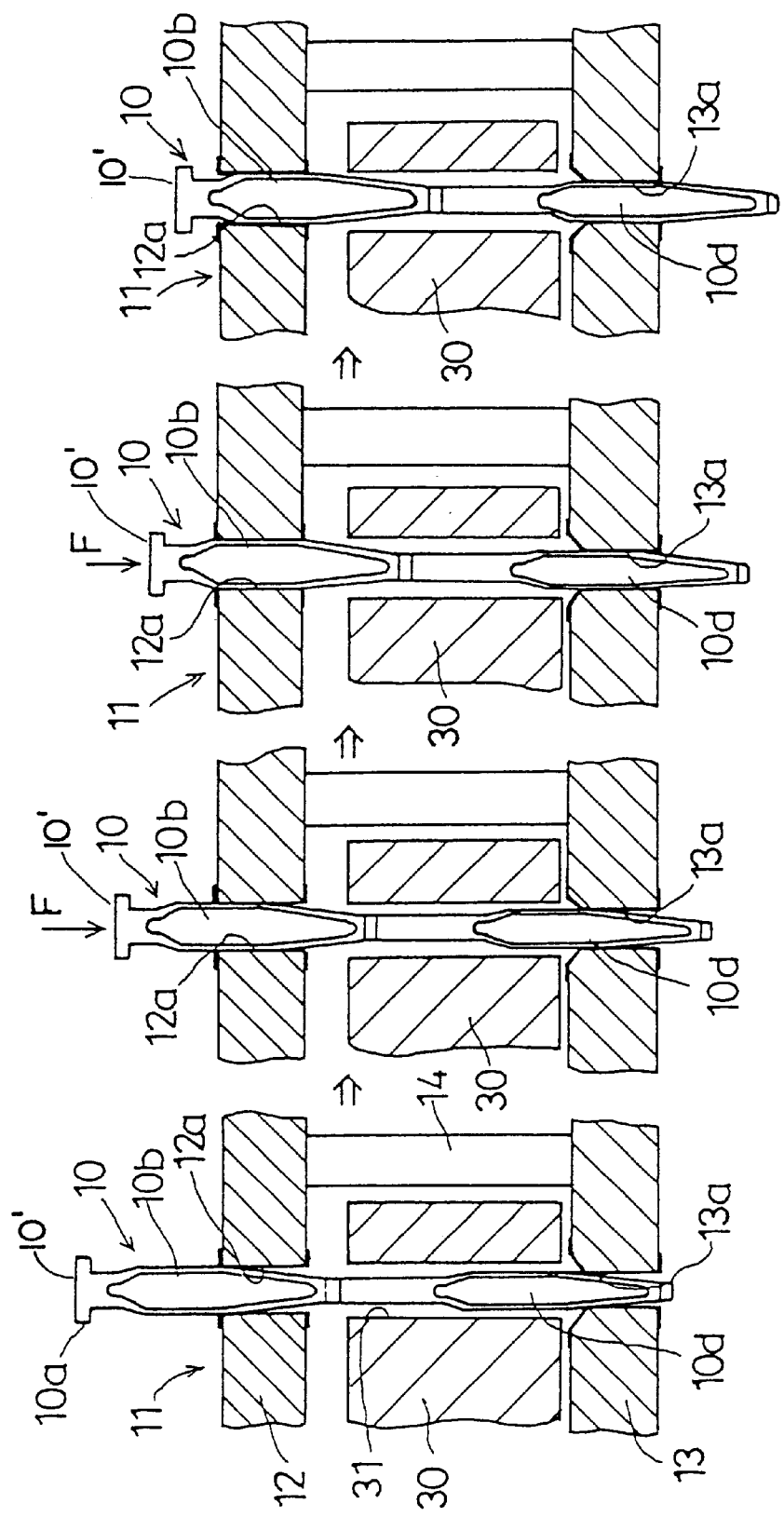

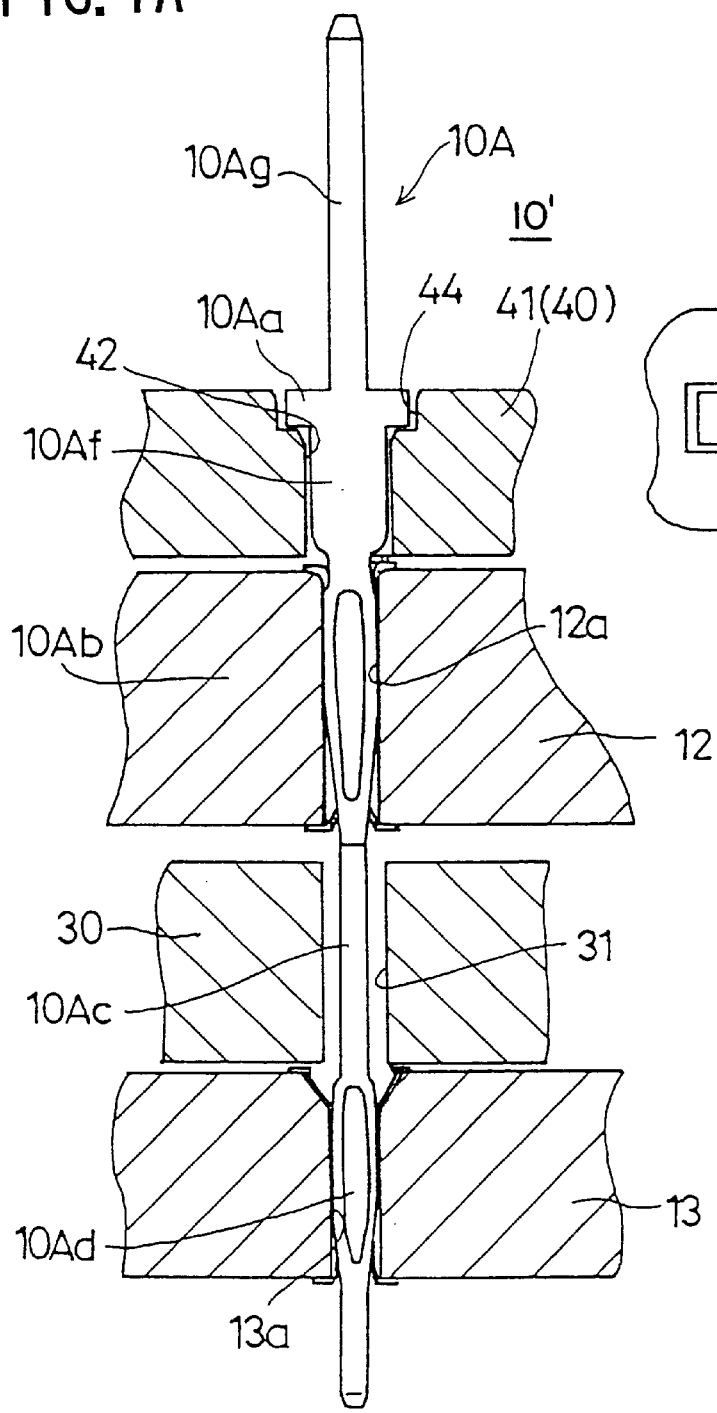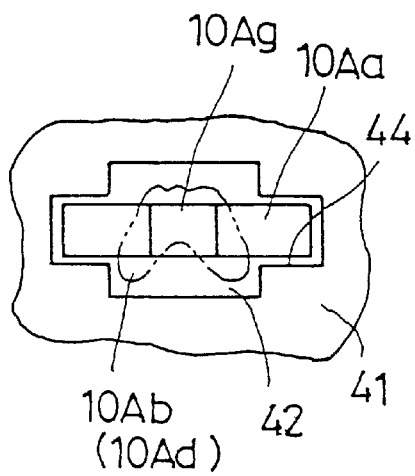
FIG. 7A
FIG. 7B

FIG. 11
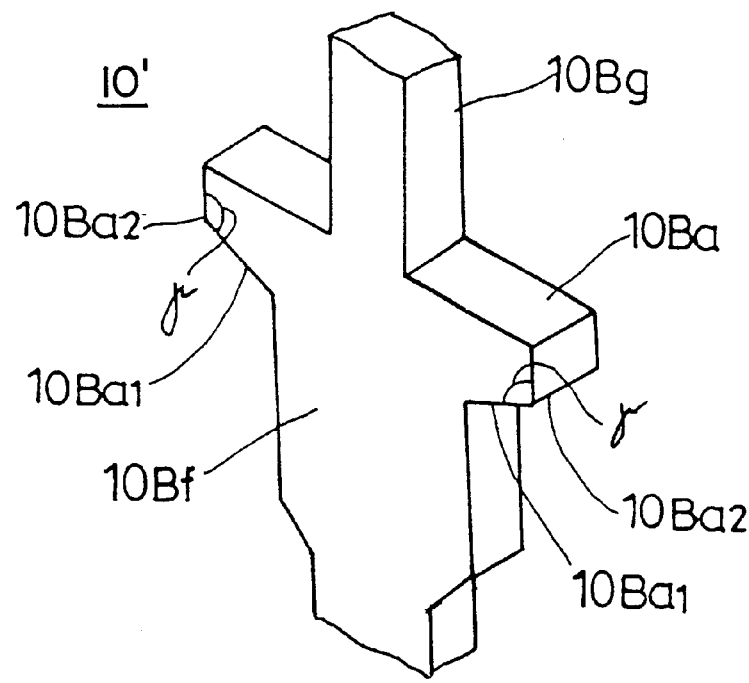
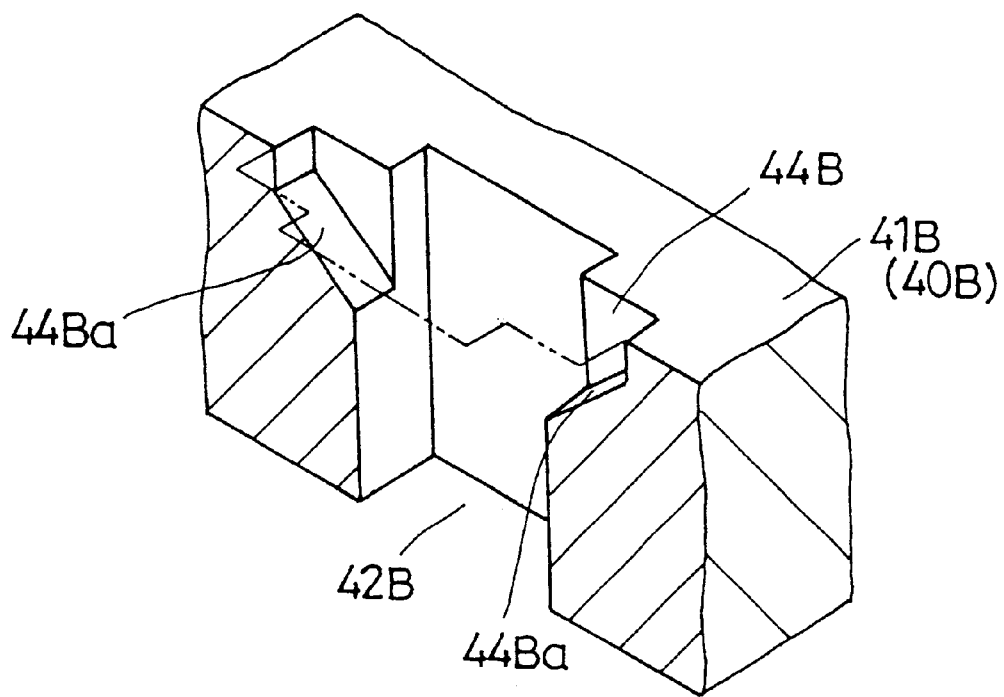

FIG. 13A
FIG. 13B
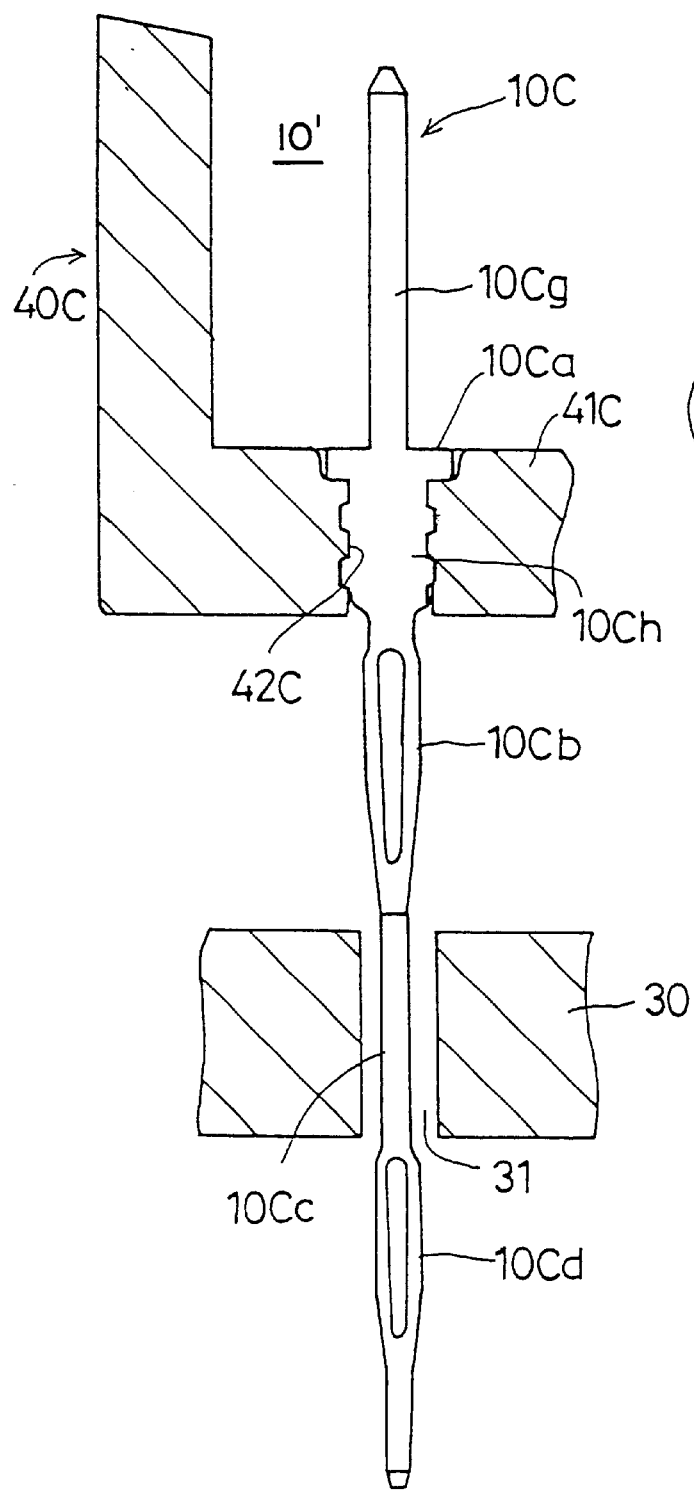
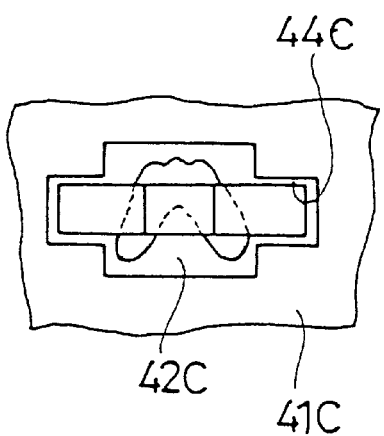

FIG. 17A
FIG. 17B
FIG. 17C
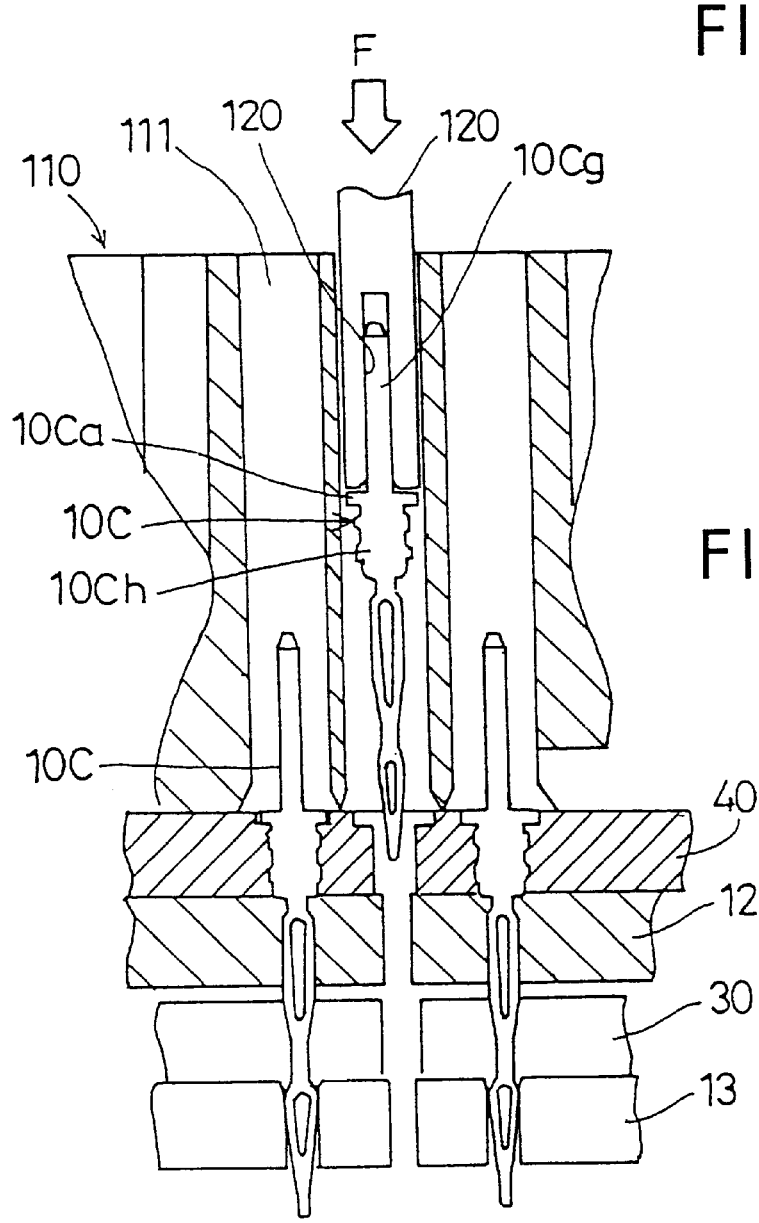
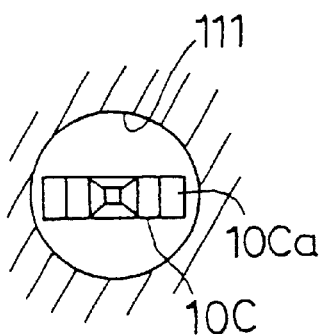
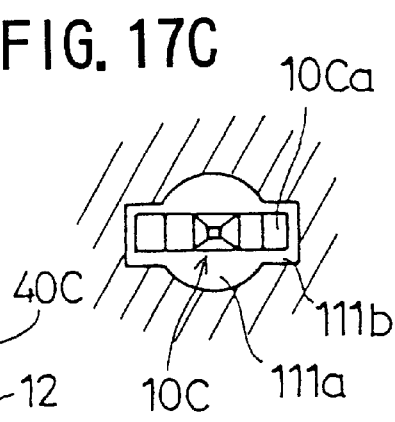

PRESS-FIT PIN, CONNECTOR AND PRINTED CIRCUIT BOARD-CONNECTED STRUCTURE

BACKGROUND OF THE INVENTION

1. Field of the Invention

The present invention relates generally to a press-fit pin, connector and printed circuit board-connected structure.

2. Description of the Related Art

The back sides of large-scale electronic equipment such as calculators and telephone exchanges have come to be connected to the electronic equipment main unit by a plurality of external cables. As the capabilities of these electronic instruments have increased so, too, has the number of external cables, to the extent that a single back wired board is insufficient and has come to be replaced with a two-piece back wired board assembly.

Specifically, that two-piece back side structure typically consists of a main back wired board electrically connected to the main unit and a sub back wired board fixedly mounted opposite to and a short distance away from the main back wired board. The sub back wired board is electrically connected to the main back wired board, with the external cables connected to the sub back wired board.

The structure that electrically connects the sub back wired board to the main back wired board bears examination. It should be noted at the outset that the density of the required electrical connections makes press-fit pins preferable to wires.

FIGS. 1A, 1B and 1C depict a conventional press-fit pin 1 as well as the state in which it appears when pressed into position in the sub- and main back wired boards. The press-fit pin 1 is suitable for use with a printed circuit board assembly 4 composed of a first printed circuit board 2 and a second printed circuit board 3 disposed opposite each other and separated by a predetermined distance. The press-fit pin 1 has two press-fit sections, an upper first section 1a and a lower second section 1b. When pressed with a force F, the press-fit pin 1 passes through the stages shown in FIGS. 1A and 1B to arrive at the state shown in FIG. 1C, with the first press-fit section 1a inserted in the through-hole 2a of the first printed circuit board 2 and the second press-fit section 1b inserted in the through-hole 3a of the second printed circuit board 3.

That is, the first and second press-fit sections 1a and 1b of the press-fit pin 1 are formed so as to fit the printed circuit board assembly 4, so that, when the press-fit pin 1 has been pressed into place and assumes the state shown in FIG. 1C, the first press-fit section 1a is positioned inside the through-hole 2a of the first printed circuit board 2 and the second press-fit section 1b is positioned inside the through-hole 3a of the second printed circuit board 3. In other words, a distance A between the center 1ac of the first press-fit section 1a and the center 1bc of the second press-fit section 1b is set so as to be equivalent to a distance B between the center of the first printed circuit board 2 in the direction of the thickness of the first printed circuit board 2 and the center of the second printed circuit board 3 in the direction of the thickness of the second printed circuit board 3.

At this point a discussion of the force required to press the press-fit pin 1 into place is necessary. It is useful to think of this required force as two separate forces, one force required to press the first press-fit section 1a into the first through-hole 2a and another force required to press the second press-fit section 1b into the second through-hole 3a. As shown in FIG. 2, the force required to press the first press-fit section 1a into the first through-hole 2a changes as shown by line I. Similarly, the force required to press the second press-fit section 1b into the second through-hole 3a also changes as shown by line II in FIG. 2. The total force required to press the press-fit pin 1 into place during the course of the pressing process is shown by line III, and is the sum of the force represented by line I and the force represented by line II.

As can be observed from FIG. 2, the insertion of the first press-fit section 1a into the through-hole 2a of the first printed circuit board 2 and the insertion of the second press-fit section 1b into the through-hole 3a of the second printed circuit board 3 takes place at the same time, so the peak 5 of the force represented by line I and the peak 6 of the force represented by line II appear at substantially the same time as well. Accordingly, the total force required to press the press-fit pin 1 into place has a high peak 7 as shown in FIG. 2. As a result, a large compressive force in the axial direction is exerted on the press-fit pin 1 when the press-fit pin 1 is pressed into position and there is thus a possibility that the press-fit pin 1 may be bent in the process. If the press-fit pin 1 is bent the bent press-fit pin 1 must be extracted and replaced with a new press-fit pin 1, interrupting the process of pressing the press-fit pins 1 into place and decreasing the efficiency of the overall production operation.

SUMMARY OF THE INVENTION

Accordingly, it is the object of the present invention to provide an improved and useful press-fit pin, connector and printed circuit board-connected structure, in which the disadvantage described above is eliminated.

The above-described object of the present invention is achieved by a press-fit pin comprising:

a first press-fit section to be pressed into a first through-hole provided on a first printed circuit board; and a second press-fit section located closer to a tip of the press-fit pin than the first press-fit section, the second press-fit section to be pressed into a second through-hole provided on a second printed circuit board separated from the first printed circuit board by a predetermined distance, the first press-fit section and the second press-fit section disposed so that the first press-fit section enters a first through-hole of a first printed circuit board at a time different from a time at which the second press-fit section enters a second through-hole in a second printed circuit board.

Additionally, the above-described object of the present invention is also achieved by the press-fit pin as described above, wherein the first press-fit section and the second press-fit section are disposed so as to be separated by a distance J between a center of a central portion of maximum diameter of the first press-fit section and a center portion of maximum diameter of the second press-fit section, such that the distance J is shorter than a distance C separating a center of the first through-hole in a direction of a thickness of the first printed circuit board and a center of the second through-hole in a direction of a thickness of the second printed circuit board.

Additionally, the above-described object of the present invention is also achieved by the press-fit pin as described above, wherein the first press-fit section and the second press-fit section are disposed so that a first boundary between a central portion of maximum diameter and an adjacent tapered portion of the first press-fit section and a second boundary between a central portion of maximum diameter and an adjacent tapered portion of the second press-fit section are separated by the distance J, such that the distance J is shorter than the distance C separating the center of the first through-hole in the direction of the thickness of the first printed circuit board and the center of the second through-hole in the direction of the thickness of the second printed circuit board.

According to the press-fit pin of the present invention, the points in time at which the pressing forces required to press the first and second press-fit sections into position peak are staggered and do not coincide, and therefore the total amount of pressing force required to press the press-fit pin into position is reduced compared to the conventional press-fit pin. As a result, the danger that the press-fit pin might bend during insertion can be reduced or eliminated.

Additionally, the above-described object of the present invention is also achieved by the press-fit pin as described above, wherein the first press-fit section and the second press-fit section are disposed so that the first press-fit section enters the first through-hole of the first printed circuit board before the second press-fit section enters the second through-hole of the second printed circuit board.

According to the press-fit pin of the present invention, the axial compressive force exerted on that section of the pin between the first and second printed circuit boards during a pressing operation to press the press-fit pin into position is less than the axial compressive force so exerted when the first press-fit section enters the first through-hole after the second press-fit section enters the second through-hole.

Additionally, the above-described object of the present invention is also achieved by the press-fit pin as described above, wherein a top of the press-fit pin opposite a side of the first press-fit section on which is disposed the second press-fit section is flattened so as to disperse a pressing force exerted thereon.

According to the press-fit pin of the present invention, the pressing force exerted on the press-fit pin is stabilized. Additionally, when the press-fit pin is pressed into position the flange section presses on and fixedly mounts the connector shroud on the printed circuit board assembly, therefore no dedicated member is required to mount the connector shroud on the printed circuit board assembly.

Additionally, the above-described object of the present invention is also achieved by the press-fit pin as described above, comprising further a contact section extending from the top toward a side opposite the first press-fit section.

According to the press-fit pin of the present invention, by pressing the press-fit pin into position from the connector shroud side in a state in which the connector shroud is positioned atop the printed circuit board assembly, the connector and the printed circuit board assembly can be made to form a single assembly.

Additionally, the above-described object of the present invention is also achieved by the press-fit pin as described above, wherein a lower side of the tip of the press-fit pin comprises further an obtuse angle section.

According to the press-fit pin of the present invention, differences in height arising when the press-fit pins have been pressed into position can be absorbed.

Additionally, the above-described object of the present invention is also achieved by a connector comprising:
a connector shroud; and
a press-fit pin penetrating the connector shroud,
the press-fit pin having, in order from the top, a contact section, a flange section, a bulge section, a first press-fit section and a second press-fit section, the bulge section being inserted into and fixedly mounted on a connector shroud bottom, the contact section projecting into the interior of the connector shroud, the first press-fit section and the second press-fit section projecting beyond a bottom of the connector shroud, the first press-fit section and the second press-fit section disposed so that the first press-fit section enters a first through-hole of a first printed circuit board at a time different from a time at which the second press-fit section enters a second through-hole in a second printed circuit board.

According to the connector of the present invention the points in time at which the pressing forces required to press the first and second press-fit sections into position peak are staggered and do not coincide, and therefore the total amount of pressing force required to press the press-fit pin into position is reduced compared to the conventional press-fit pin. As a result, the danger that the press-fit pin might bend when pressed into position in the printed circuit board assembly and fixedly mounting the connector on the printed circuit board assembly can be avoided.

Additionally, the above-described object of the present invention is also achieved by the connector as described above, further comprising a bend restraining member having a bend restraining through-hole engaging a portion of the connector shroud projecting beyond the bottom of the connector shroud.

According to the connector of the present invention, any bending of the press-fit pin is restricted. As a result, the danger that the press-fit pin might bend when pressed into position in the printed circuit board assembly and fixedly mounting the connector on the printed circuit board assembly can be further avoided.

Additionally, the above-described object of the present invention is also achieved by a printed circuit board-connected structure comprising:
a first printed circuit board having a first through-hole;
a second printed circuit board having a second through-hole and disposed so as to be separated from the first printed circuit board by a predetermined distance;
a connector shroud provided on the first printed circuit board; and
a press-fit pin having, in order from the top, a contact section, a flange section, a first press-fit section and a second press-fit section, the first press-fit section and the second press-fit section penetrating the connector shroud, the first press-fit section being inserted into the first through-hole, the second press-fit section being inserted into the second through-hole, the contact section projecting into the interior of the connector shroud, the first press-fit section and the second press-fit section projecting beyond a bottom of the connector shroud, the first press-fit section and the second press-fit section disposed so that the first press-fit section enters a first through-hole of a first printed circuit board at a time different from a time at which the second press-fit section enters a second through-hole in a second printed circuit board.

According to the printed circuit board-connected structure of the present invention, a printed circuit board-connected structure free of bent press-fit pins can be achieved.

Additionally, the above-described object of the present invention is also achieved by the printed circuit board-connected structure as described above, further comprising a bend restraining member disposed between the first printed circuit board and the second printed circuit board, the bend restraining member having a bend restraining through-hole engaging a portion of the connector shroud projecting beyond the bottom of the connector shroud.

According to the printed circuit board-connected structure of the present invention, a printed circuit board-connected structure free of bent press-fit pins can be further achieved.

Additionally, the above-described object of the present invention is also achieved by the printed circuit board-connected structure as described above, wherein the upper surface of the second through-hole of the second printed circuit board has a tapered section that tapers so as to narrow toward an interior of the second through-hole of the second printed circuit board.

According to the printed circuit board-connected structure of the present invention, the tip of the press-fit pin is accurately inserted into the second through-hole.

Additionally, the above-described object of the present invention is also achieved by a press jig for pressing a press-fit pin into position, comprising:

a jig comprising a block, the block having a size corresponding to a size of the connector shroud, through-holes of a size capable of admitting a press punch being arranged on said block so as to correspond to the press-fit pins previously pressed into position; and a press punch substantially cylindrical in shape and having a hole formed in a center of a bottom of the press punch for accommodating a contact section of a top of a press-fit pin.

According to the press-fit pin of the present invention, a new press-fit pin can be inserted and pressed into position after a bent press-fit pin has been extracted.

BRIEF DESCRIPTION OF THE DRAWINGS

Other objects, features and advantages of the present invention will become more apparent from the following detailed description when read in conjunction with the accompanying drawings, in which:

FIGS. 3A, 3B and 3C show a press-fit pin according to a first embodiment of the present invention, together with a printed circuit board assembly 11 in which it is used;

FIGS. 5A, 5B, 5C and 5D show the press-fit pin shown in FIG. 3 and FIG. 4 in successive stages in the process of being pressed into position on the printed circuit board assembly;

FIGS. 7A and 7B show top and side cross-sectional views of a press-fit pin according to a second embodiment of the present invention, in a state in which the press-fit pin is pressed into position;

FIG. 11 shows an engaging portion of the connector shroud of the press-fit pin shown in FIGS. 10A and 10B the connector shroud through-hole;

FIGS. 13A and 13B show expanded top and side cross-sectional views of a portion of the connector shown in FIG. 12A;

FIGS. 17A, 17B and 17C are diagrams showing a press-fit pin in a state in which it is pressed again into position.

DESCRIPTION OF THE PREFERRED EMBODIMENTS

A description will now be given of embodiments of the present invention, with reference to the accompanying drawings.

Figure 4B:
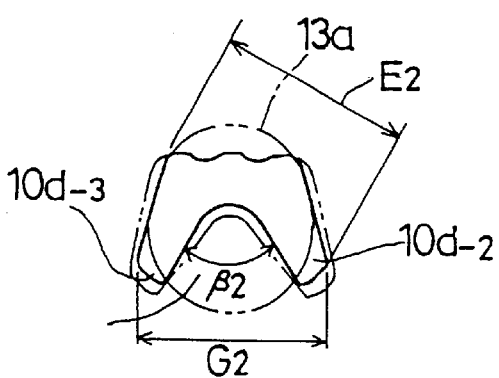
FIGS. 4A, 4B, and 4C show expanded views of the press-fit pin shown in FIG. 3.
Figure 4A:
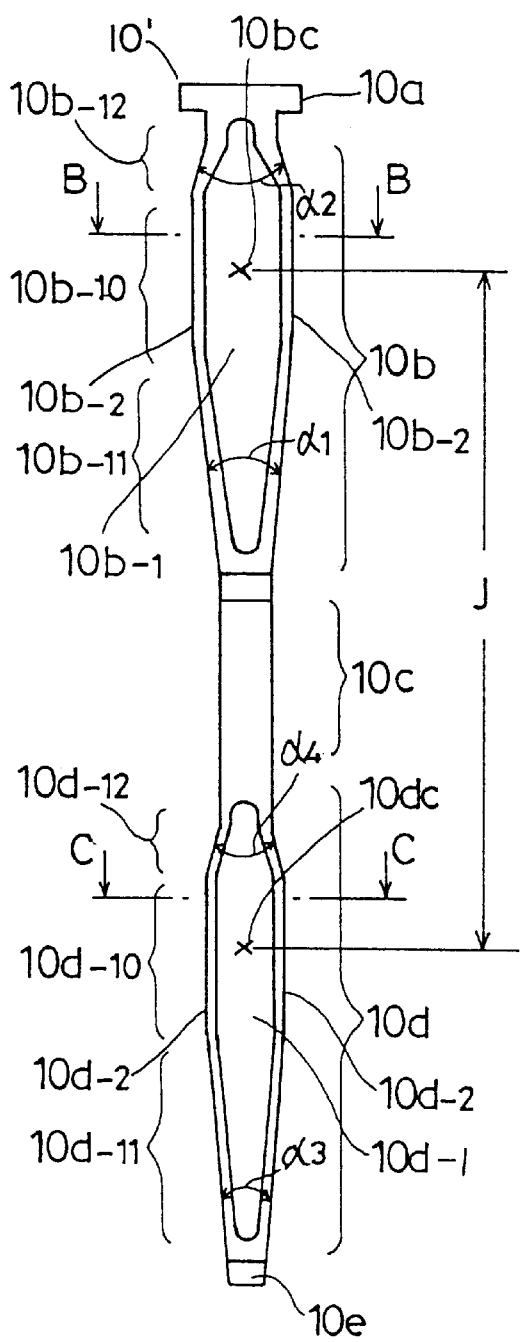
Figure 4C:
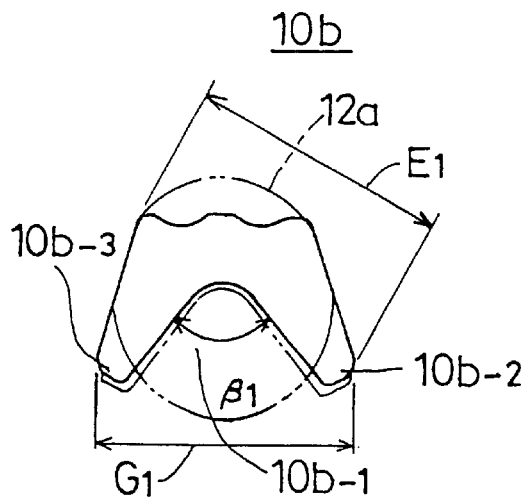

FIGS. 3A, 3B and 3C show a press-fit pin 10 according to a first embodiment of the present invention, together with a printed circuit board assembly 11 in which it is used. FIGS. 4A, 4B and 4C show expanded views of the press-fit pin 10.

As shown in FIG. 3C, the printed circuit board assembly 11 consists of a first printed circuit board 12 and a second printed circuit board 13, connected via a spacing member 14 disposed therebetween. A distance C lies between the center of the first printed circuit board 12 in the direction of the thickness of the first printed circuit board 12 and the center of the second printed circuit board 13 in the direction of the thickness of the second printed circuit board 13. First and second through-holes 12a and 13a, respectively, are formed at corresponding positions in the first and second printed circuit boards 12 and 13, respectively. A diameter d1 of the first through-hole 12a is slightly larger than a diameter d2 of the second through-hole 13a. The upper surface of the second through-hole 13a has a tapered section that tapers so as to narrow toward the interior of the second through-hole 13a of the second printed circuit board 13.

The press-fit pin 10 is produced by press processing of the pin material, to such dimensions as fit the printed circuit board assembly shown in FIG. 3C.

As shown in FIGS. 3A, 3B and 4A, the press-fit pin 10 has, in order from the top, or head 10 a flange section 10a, a first press-fit section 10b, a pin section 10c, a second press-fit section 10d and a tip section 10e.

The first press-fit section 10b is formed by making a cut in the pin material and spreading the material outward. As shown in FIG. 4B, the first press-fit section 10b further has a central depression 10b-1 and a V-shaped cross-section formed by rib portions 10b-2 and 10b-3 extending along the sides of the central depression 10b-1. The two rib portions 10b-2 and 10b-3 between them form angle β1.

IN FIG. 4B, the first through-hole 12a is superimposed on the press-fit pin in order to give an indication of the size of the first press-fit section 10b. The first press-fit section 10b has a pin diameter E1, this pin diameter E1 being larger than the diameter of the through-hole 12a. As indicated in the drawing, the first press-fit section 10b consists of a central section, or portion, 10b-10, a lower tapered section, or portion, 10b-11 and an upper tapered section, or portion, 10b-12. The central section 10b-10 is that section in which the two rib portions 10b-2 and 10b-3 are parallel, with a distance G1 between the edge of rib portion 10b-2 and the edge of rib portion 10b-3. Lower tapered section 10b-11 is that section in which rib portions 10b-2 and 10b-3 form an inverse triangle. Upper tapered section 10b-12 is that section in which rib portions 10b-2 and 10b-3 form a triangle. Lower tapered section 10b-11 is the first section to enter the first through-hole 12a, and in order to ease entry the angle α1 is approximately 10 degrees smaller than angle α2. Central section 10b-10 is that section which is pressed and inserted into the first through-hole 12a.

10bc is the center of first press-fit section 10b, and coincides with the center of central section 10b-10.

The second press-fit section 10d, like the first press-fit section 10b, is formed by making a cut in the pin material and spreading the material outward. As shown in FIG. 4C, the second press-fit section 10d has a central depression 10d-1 and a V-shaped cross-section formed by rib portions 10d-2 and 10d-3 extending along the sides of the central depression 10d-1. The two rib portions 10d-2 and 10d-3 between them form angle β2. As indicated in FIG. 4B, angle β2 is smaller than angle β1 formed between rib portions 10b-2 and 10b-3 of the first press-fit section 10b in order to ease the insertion of the second press-fit section 10d into the second through-hole 13a.

In FIG. 4C, the second through-hole 13a is superimposed on the press-fit pin in order to give an indication of the size of the second press-fit section 10d. The second press-fit section 10d has a pin diameter E2, this pin diameter E2 being larger than the diameter of the through-hole 13a. As indicated in the drawing, the second press-fit section 10d consists of a central section, or portion, 10d-10, a lower tapered section, or portion, 10d-11 and an upper tapered section, or portion, 10d-12. The central section 10d-10 is that section in which the two rib portions 10d-2 and 10d-3 are parallel, with a distance G2 between the edge of rib portion 10d-2 and the edge of rib portion 10d-3. Lower tapered section 10d-11 is that section in which rib portions 10d-2 and 10d-3 form an inverse triangle. Upper tapered section 10d-12 is that section in which rib portions 10d-2 and 10d-3 form a triangle. Lower tapered section 10d-11 is the first section to enter the second through-hole 13a, and in order to ease entry the angle α3 is approximately 10 degrees smaller than angle α4. Central section 10d-10 is that section which is pressed and inserted into the second through-hole 13a.

10dc is the center of second press-fit section 10d, and coincides with the center of central section 10d-10.

As shown in FIG. 3, the first press-fit section 10b and the second press-fit section 10d are disposed so that a distance J between the center 10bc of the first press-fit section 10b and the center 10dc of the second press-fit section 10d is smaller than the above-described distance C of the printed circuit board assembly 11 by a distance K.

It should be noted that the distance between a first boundary between the central section of maximum diameter 10b-10 and the adjacent tapered section 10b-11 of the first press-fit section 10b and a second boundary between the central section of maximum diameter 10d-10 and the adjacent tapered section 10d-11 of the second press-fit section 10d are separated by a distance J that is identical to the distance J described above.

A description will now be given of an operation when pressing the press-fit pin 10 described above into position in the printed circuit board assembly 11.

When a pressing force F is applied to head 10 and a flange section 10a the press-fit pin 10 passes through the stages shown in FIGS. 5A, 5B and 5C to end ultimately at the position shown in FIG. 5D, with the first press-fit section 10b inserted in the first through-hole 12a of the first printed circuit board 12 and the second press-fit section 10d inserted into the second through-hole 13a of the second printed circuit board 13. FIG. 5A shows a state in which the press-fit pin 10 is merely set on the first and second through-holes 12a and 13a, respectively, prior to commencing any pressing operation to insert the press-fit pin 10 into the first and second through-holes 12a and 13a. FIG. 5B shows an initial state of pressing and FIG. 5C shows a state in which pressing has proceeded further.

As described above, the dimension or distance J between the center 10bc of the first press-fit section 10b and the center 10dc of the second press-fit section 10d is smaller than the distance C between the centers of the printed circuit boards of the printed circuit board assembly 11. As a result, when the press-fit pin is in a state like that shown in FIG. 5A, the lower tapered section 10b-11 of the first press-fit section 10b enters the first through-hole 12a while the lower edge of the central section 10b-10 is still positioned at the opening of through-hole 12a. The second press-fit section 10d passes lightly through the first through-hole 12a, with the lower tapered section 10d-11 of the second press-fit section 10d guided by tapered section 13a-1 into the second through-hole 13a while the central section 10d-10 has not yet reached the second through-hole 13a.

A pressing operation commences with the press-fit pin in the state described above and depicted in FIG. 5B. As a result of the commencement of the pressing operation, the central section 10b-10 of the first press-fit section 10b begins to enter the first through-hole 12a. The central section 10d-10 of the second press-fit section 10d begins to enter the second through-hole 13a slightly after the central section 10b-10 of the first press-fit section 10b begins to enter the first through-hole 12a.

As the pressing operation proceeds a stage like that shown in FIG. 5C is reached, in which the entire central section 10b-10 of the first press-fit section 10b is pressed into the first through-hole 12a while a substantial portion of the central section 10d-10 of the second press-fit section 10d is pressed into the second through-hole 13a.

With the pressing operation completed as shown in FIG. 5D, the entire central section 10b-10 of the first press-fit section 10b is pressed further into the first through-hole 12a and the entire central section 10d-10 of the second press-fit section 10d is pressed into the second through-hole 13a.

Figure 6:
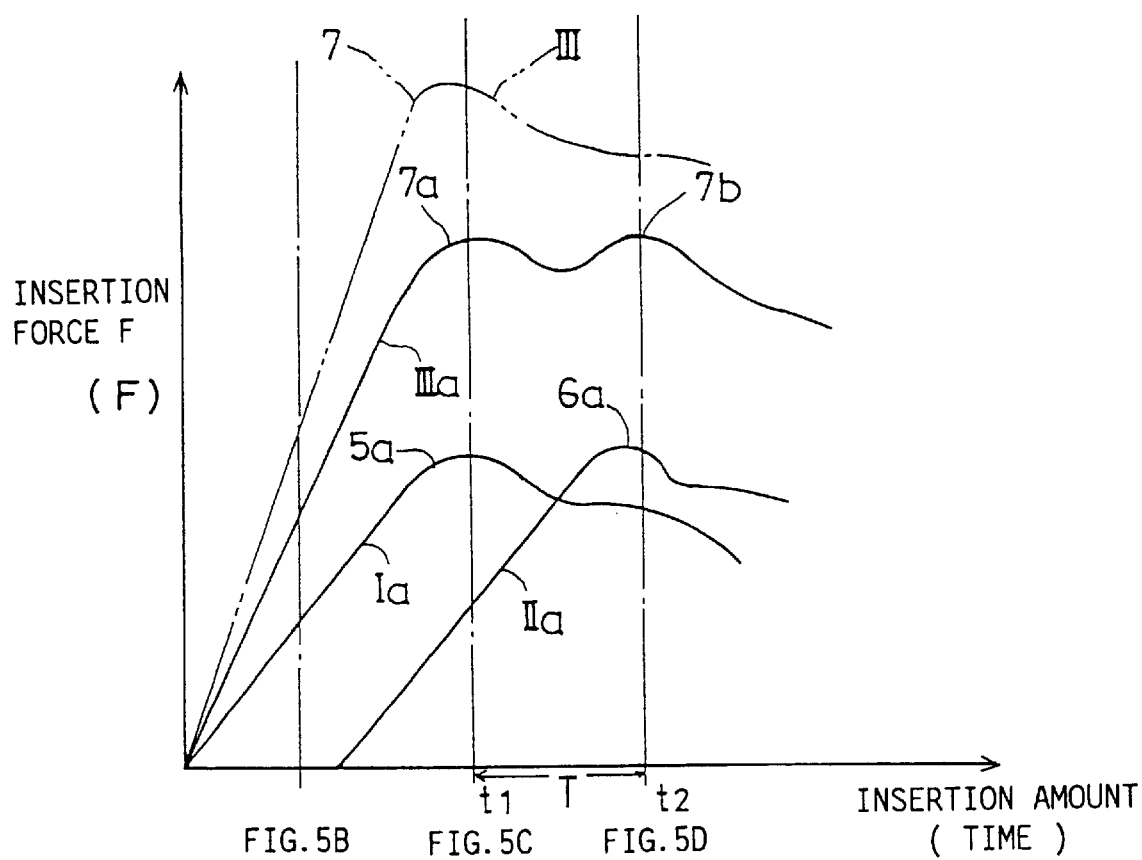
FIG. 6 is a chart showing the force required to press the press-fit pin shown in FIG. 3 and FIG. 4 into position at different stages in the pressing process.

It should be noted that the force required to insert the press-fit pin varies during the course of the pressing operation. It is useful to think of this force as two separate forces, one required to press the first press-fit section 10b into the first through-hole 12a and another required to press the second press-fit section 10d into the second through-hole 13a. As shown in FIG. 6, the force required to press the first press-fit section 10b into the first through-hole 12a varies as indicated by the line Ia. Similarly, the force required to press the second press-fit section 10d into the second through-hole 13a varies as indicated by the line IIa. The total force required during the pressing operation to press the press-fit pin 10 into place is the sum of the force indicated by line Ia and the force indicated by line IIa.

As can be appreciated from FIGS. 5A, 5B, 5C and 5D, the peak 5*a* of the force represented by line Ia appears at a time t1 when the entire central portion 10*b*-10 of the first press-fit section 10*b* is inserted in the first through-hole 12*a* as shown in FIG. 5C. By contrast, the peak 6*a* of the force represented by line IIa appears at a time t2 when the entire central portion 10*d*-10 of the second press-fit section 10*d* is inserted in the second through-hole 13*a* as shown in FIG. 5D.

Figure 1A:
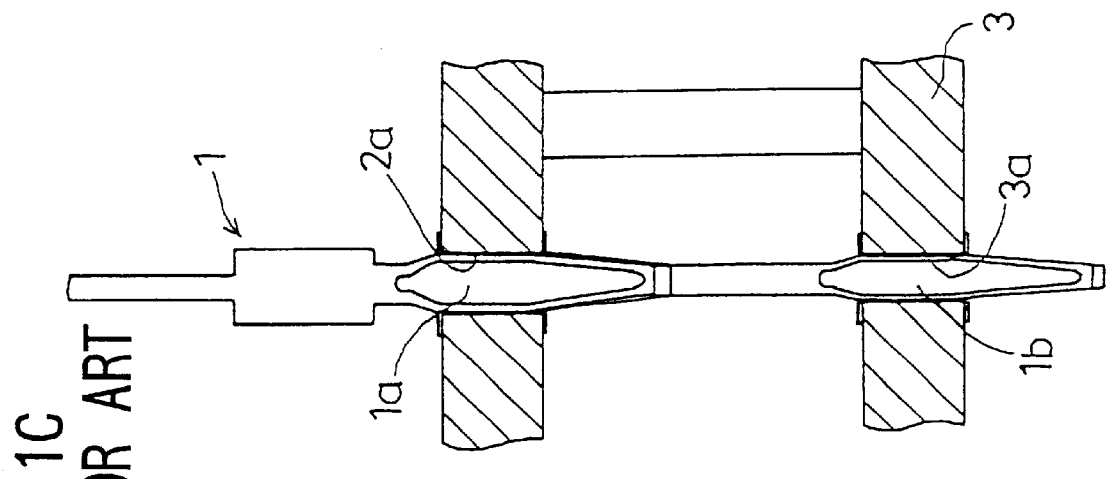
FIGS. 1A, 1B and 1C are diagrams showing a conventional press-fit pin 1 as well as the state in which it appears when pressed into position.
Figure 1B:
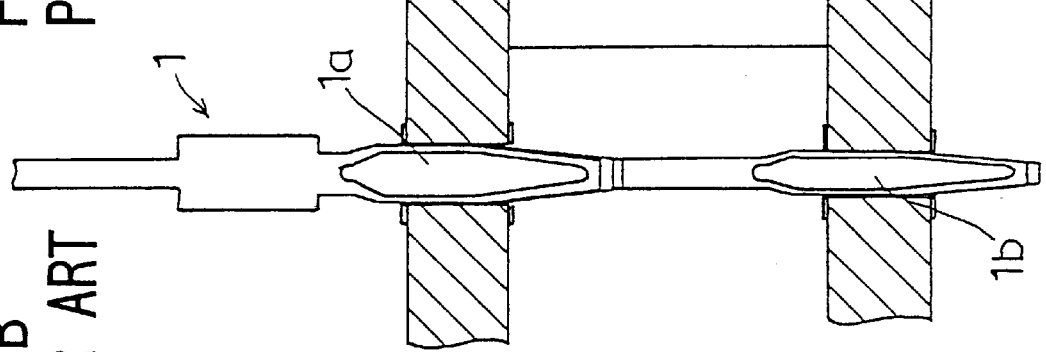
Figure 1C:
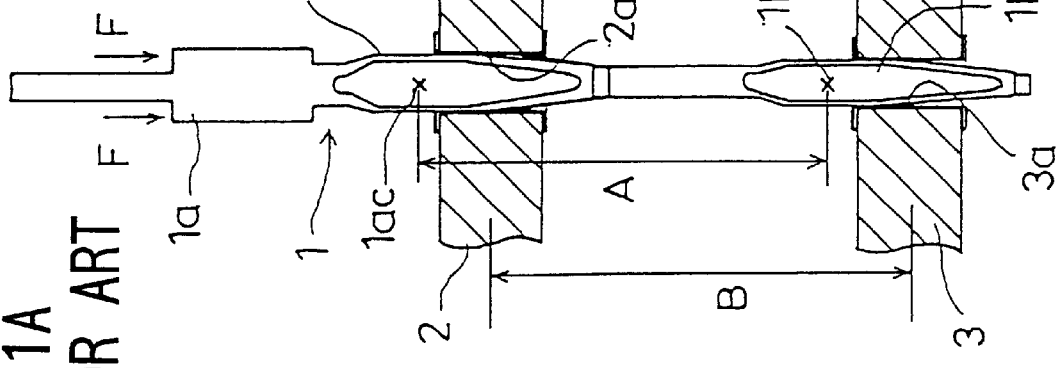
Figure 2:
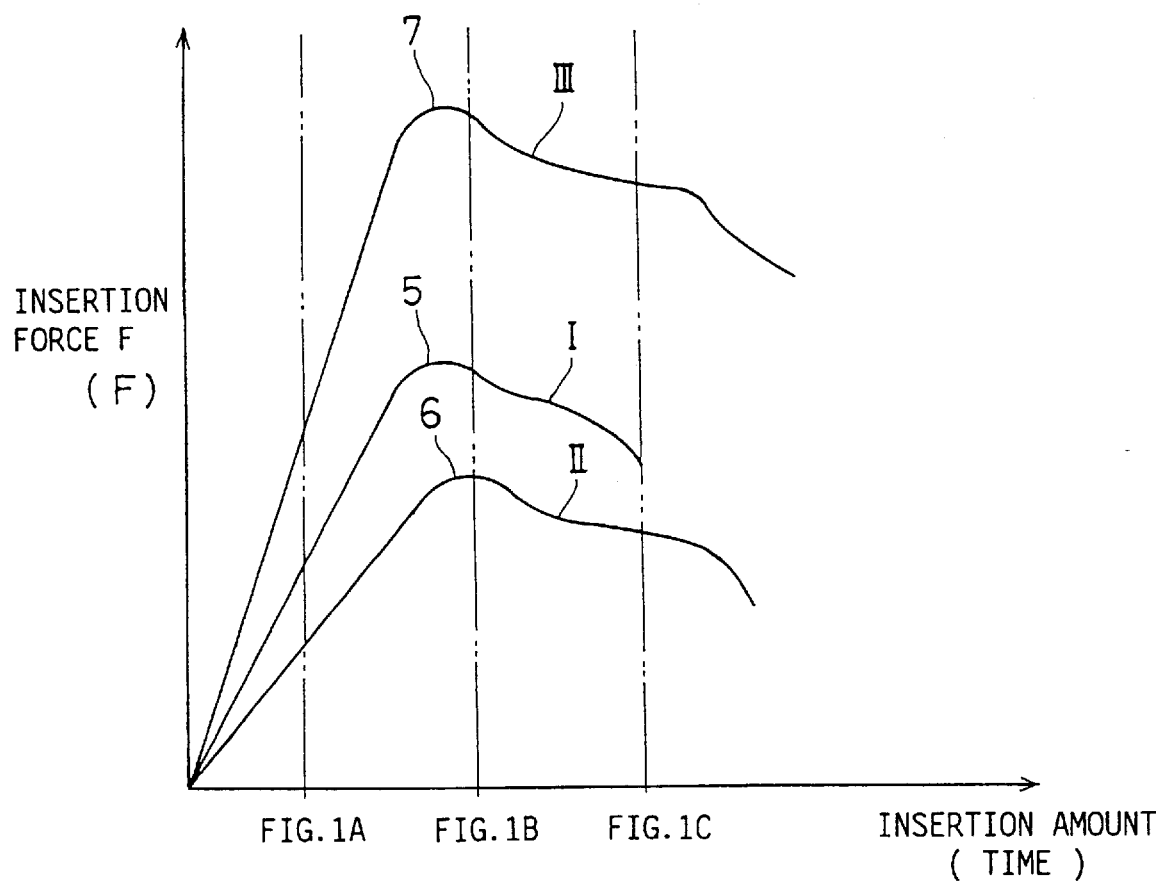
FIG. 2 is a chart showing the relation between the force required to press the conventional press-fit pin into position at different stages in the pressing process.

Accordingly, t2 of peak 6*a* lags t1 of peak 5*a* by a time T, so the total pressing force as indicated by line IIIa exhibits peaks 7*a* and 7*b* that are substantially lower than the conventional peak 7 shown in FIG. 2, indicating a reduced total pressing force compared to the conventional press-fit pin configuration, in which the first and second press-fit sections enter their respective through-holes simultaneously.

As a result, according to the present invention it is possible to use less force than conventionally to press the press-fit pin 10 into position in the printed circuit board assembly 11. Accordingly, by using the press-fit pin 10 according to the present invention the amount of axially compressive force exerted on that section of the press-fit pin 10 between the first printed circuit board 12 and the second printed circuit board 13 can be reduced and thus the danger that the press-fit pin 10 might bend between the first printed circuit board 12 and the second printed circuit board 13 can be avoided. In addition, it will be appreciated that the danger of bending that section of the press-fit pin 10 above the first printed circuit board 12 is also reduced or eliminated.

As a result, the work of pressing a plurality of press-fit pins into position can proceed efficiently, without the interruption caused by bent pins which must be extracted and replaced.

Additionally, the central section 10*b*-10 of the first press-fit section 10*b* is inserted into the first through-hole 12*a* before the central section 10*d*-10 of the second press-fit section 10*d* is inserted into the second through-hole 13*a*, a disposition which, when compared to the reverse, in which the central section 10*b*-10 of the first press-fit section 10*b* is inserted into the first through-hole 12*a* after the central section 10*d*-10 of the second press-fit section 10*d* is inserted into the second through-hole 13*a*, results in reduced compressive force acting on that section of the press-fit pin 10 between the first printed circuit board 12 and the second printed circuit board 13.

Additionally, the pressing force is exerted on the wide flange section 10*a*, so the pressing force is applied evenly and the press-fit pin 10 is inserted evenly.

When a plurality of press-fit pins 10 are pressed into position as shown in FIG. 5D, the first printed circuit board 12 and the second printed circuit board 13, joined via a spacing member 14, are electrically connected by the press-fit pins 10 to form a printed circuit board-connected structure 20.

It should be noted that, as shown in FIG. 5A, a bend restraining member 30 is provided between the first printed circuit board 12 and the second printed circuit board 13 of the printed circuit board assembly 11. The bend restraining member 30 provides a bend restraining through-hole 31 for each press-fit pin 10 in order to restrain or inhibit any bending of the press-fit pin 10. By providing this bend restraining member 30, any possible bending of that section of the press-fit pin 10 lying between the first and second printed circuit boards 12 and 13 is restrained by the inner peripheral wall of the bend restraining through-hole 31 of the bend restraining member 30, thus further restraining any bending of the press-fit pins 10.

A description will now be given of a second embodiment of the present invention.

FIGS. 7A and 7B show a press-fit pin 10A according to a second embodiment of the present invention. The press-fit pin 10A acts to press the connector shroud onto the printed circuit board assembly 11 when the press-fit pin 10A is pressed into position in the printed circuit board assembly 11. The press-fit pin 10A has a press-fit section configuration identical to the press-fit section configuration of the press-fit pin 10 described above with respect to the first embodiment and a discussion thereof is thus omitted.

Figure 8:
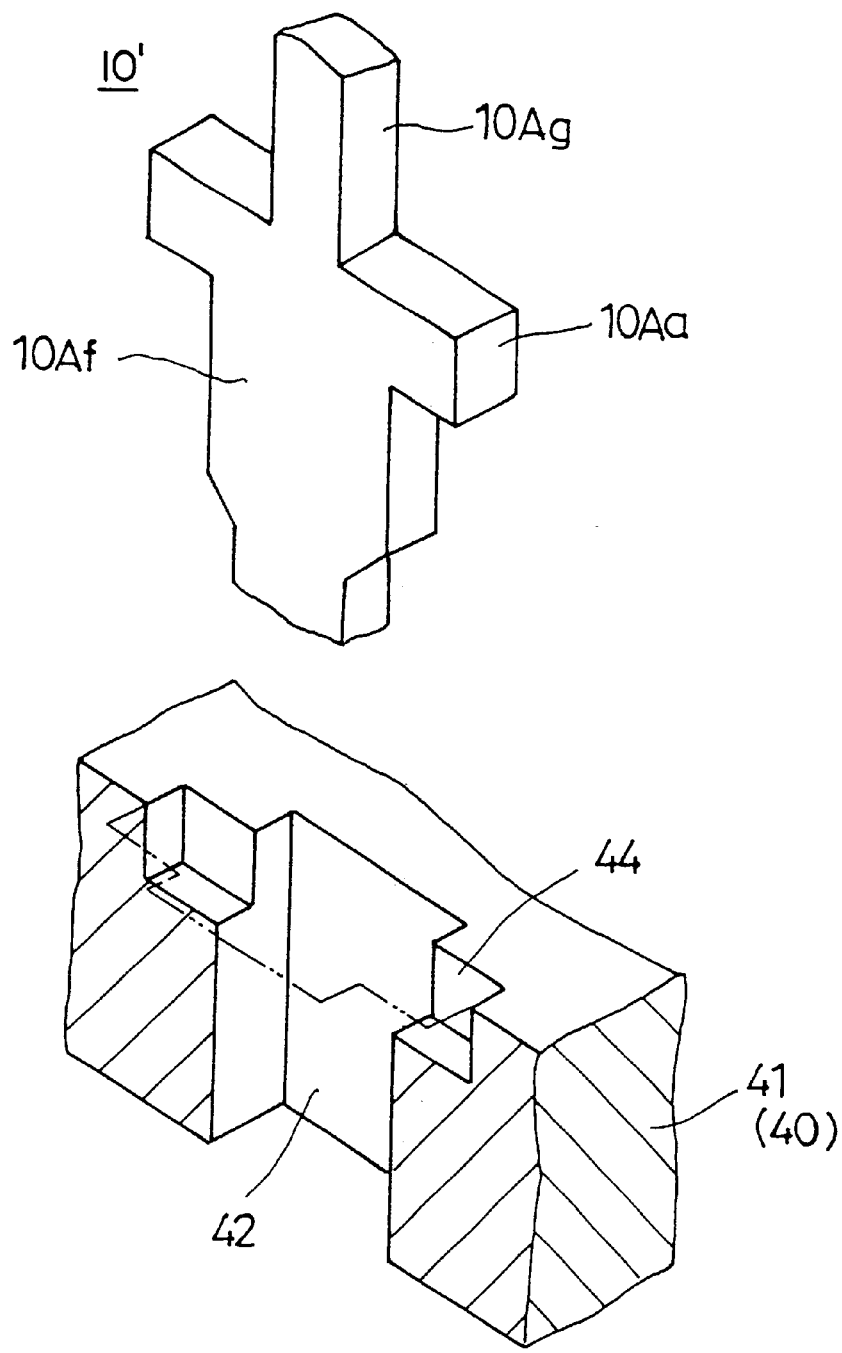
FIG. 8 shows an engaging portion of the connector shroud of the press-fit pin shown in FIG. 7 and the connector shroud through-hole.

The press-fit pin 10A has a connector shroud engaging section 10A*f* on the head 10 top of the press-fit pin 10 shown in FIGS. 3A and 3B, and, further, a contact section 10A*g* extending upward from the connector shroud engaging section 10A*f*. As shown in FIG. 8, the connector shroud engaging section 10A*f* of head 10 has a flange section 10A*a* formed thereon. As shown in FIG. 7A, the press-fit pin 10A has, in order from the top, a contact section 10A*g*, a flange section 10A*a*, a connector shroud engaging section 10A*g*, a first press-fit section 10A*b*, a pin section 10A*c*, a second press-fit section 10A*d* and a tip section 10A*e*.

The connector shroud 40 has a bottom plate 41, a through-hole 42 formed on the bottom plate 41 and into which a press-fit pin 10A is inserted and a positioning boss 43 formed on a bottom surface of the bottom plate 41. As shown in FIG. 8, the through-hole 42 has a size sufficiently large to admit the second press-fit section 10A*d* and the first press-fit section 10A*b*, and, further, has a concavity 44 on both sides of the top into which the flange section 10A*a* fits.

Figure 9A:
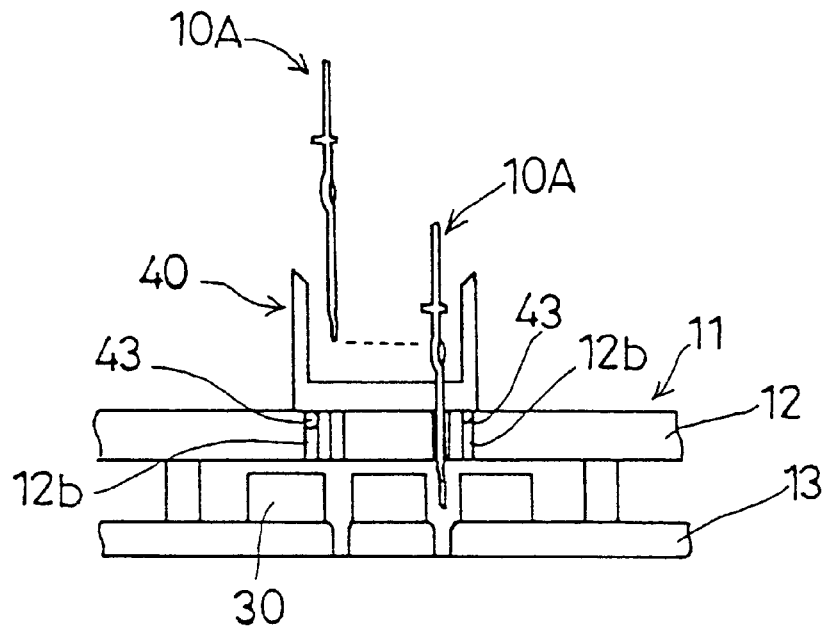
FIGS. 9A and 9B show the printed circuit board-connected structure created by pressing the press-fit pin shown in FIG. 7 into position.
Figure 9B:
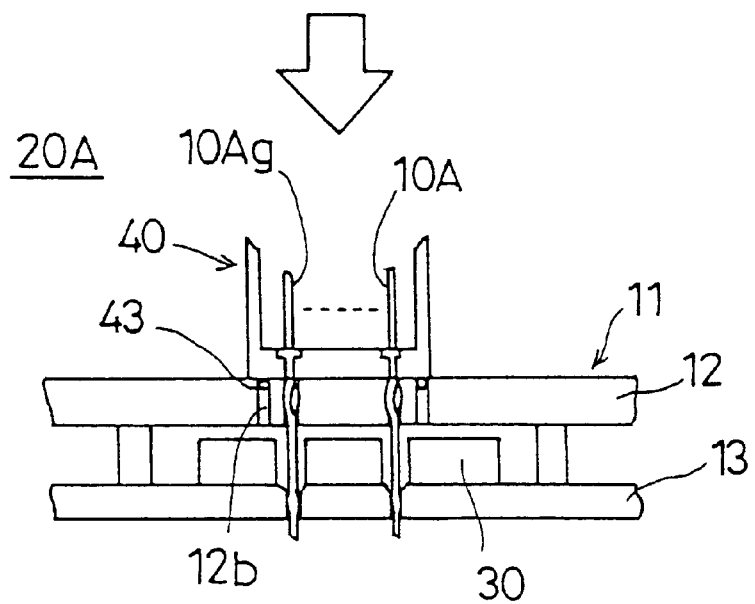

As shown in FIGS. 9A and 9B, in a state in which the positioning boss 43 of the connector shroud 40 is engaged with a positioning hole 12*b* of the first printed circuit board 12 of the printed circuit board assembly 11, the press-fit pin 10A is inserted, in order from the top or head 10, into the connector shroud 40 through-hole 42, the first through-hole 12*a* of the first printed circuit board 12, the bend restraining through-hole 31 of the bend restraining member 30 and the second through-hole 13*a* of the second printed circuit board 13. As with the first embodiment, the first press-fit section 10A*b* and the second press-fit section 10A*d* are positioned so as to enter the first through-hole 12*a* and the second through-hole 13*a*, respectively, at different times. As a result, less force is required to press the press-fit pin 10A into place.

The connector shroud 40 is fixedly mounted on the printed circuit board assembly 11 by the engaging section 10A*f* of the connector shroud of the press-fit pin 10A pressed into and fixedly mounted on the printed circuit board assembly 11 being fitted into the through-hole 42 and the flange section 10A*a* being fitted into the concavity 44, thus restricting the flotation of the connector shroud 40 from the first printed circuit board 12 of the printed circuit board assembly 11.

When a plurality of press fit pins 10A have been pressed into position the printed circuit board-connected structure 20A is complete. As shown in FIG. 9A, the printed circuit board-connected structure 20A is disposed such that the first printed circuit board 12 and the second printed circuit board 13 are electrically connected by the plurality of press-fit pins 10A pressed into position, with the connector 50 forming a single unit with the printed circuit board assembly 11. The connector 50 comprises the connector shroud 40 and the plurality of contact sections 10A*g* projecting from an inner side of the connector shroud 40.

Additionally, the flange sections 10A*a* of the individual press-fit pins 10A pressed into position press and fixedly mount the connector shroud 40 onto the printed circuit board assembly 11, thereby eliminating the need for a dedicated member for fixedly mounting the connector shroud 40 on the printed circuit board assembly 11.

A description will now be given of a third embodiment of the present invention.

Figure 10A:
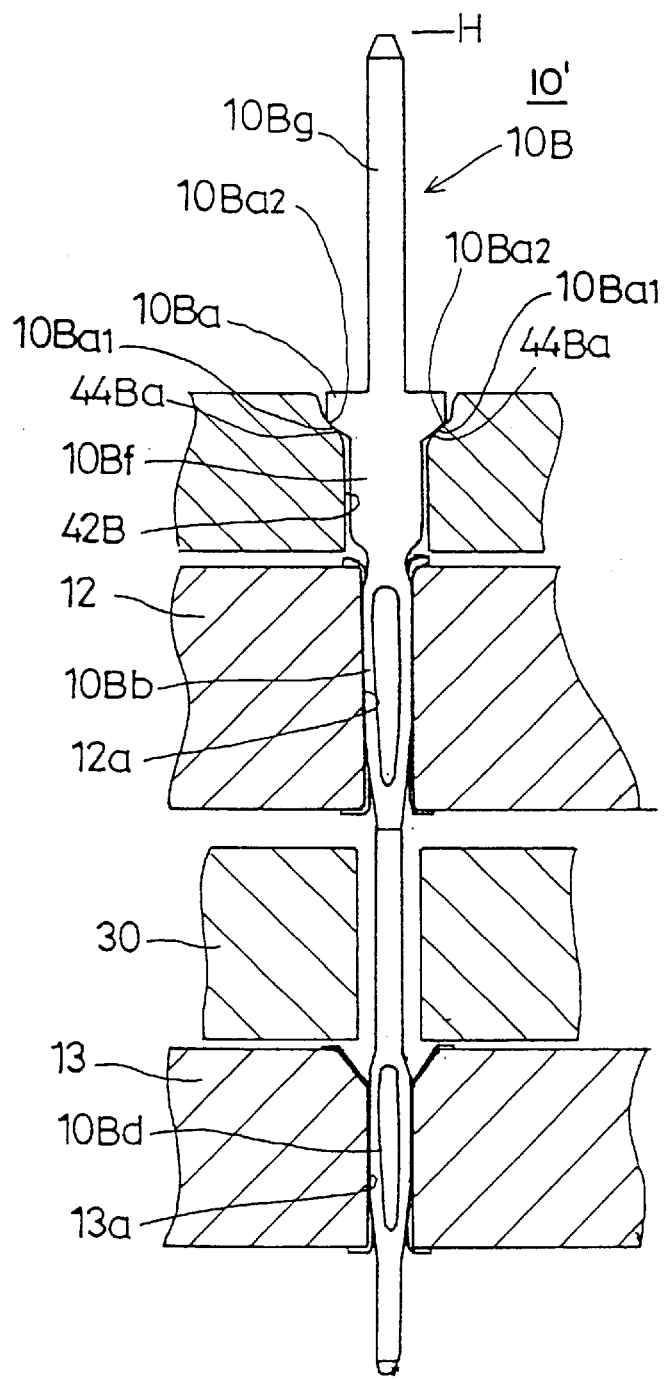
FIGS. 10A and 10B show top and side cross-sectional views of a press-fit pin according to a third embodiment of the present invention, in a state in which the press-fit pin is pressed into position.
Figure 10B:
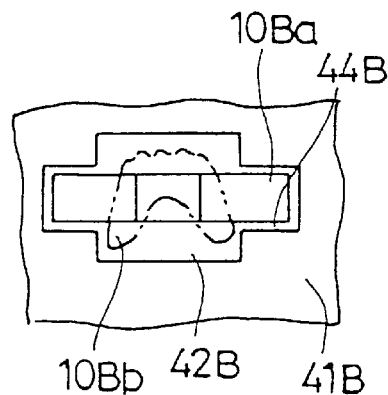

FIGS. 10A and 10B show a press-fit pin 10B according to a third embodiment of the present invention. The press-fit pin 10B so depicted is identical to the press-fit pin shown in FIGS. 7A and 7B except for the flange section 10Ba of head 10, which in this third embodiment has a slanted lower surface 10Ba1 and an obtuse angled tip section 10Ba2.

As shown in FIG. 11, the concavity 44B of the through-hole 42B of the connector shroud 40B has a slanted bottom surface 44Ba.

An obtuse angle section 10Ba2 of the flange section 10Ba fits into the slanted bottom surface 44Ba of the concavity 44B of the connector shroud 40B, thus absorbing any discrepancy in height when the press-fit pins 10B are pressed into position. Accordingly, the accuracy requirement for any device for pressing the pins into position can be eased.

A description will now be given of a fourth embodiment of the present invention.

Figure 12A:
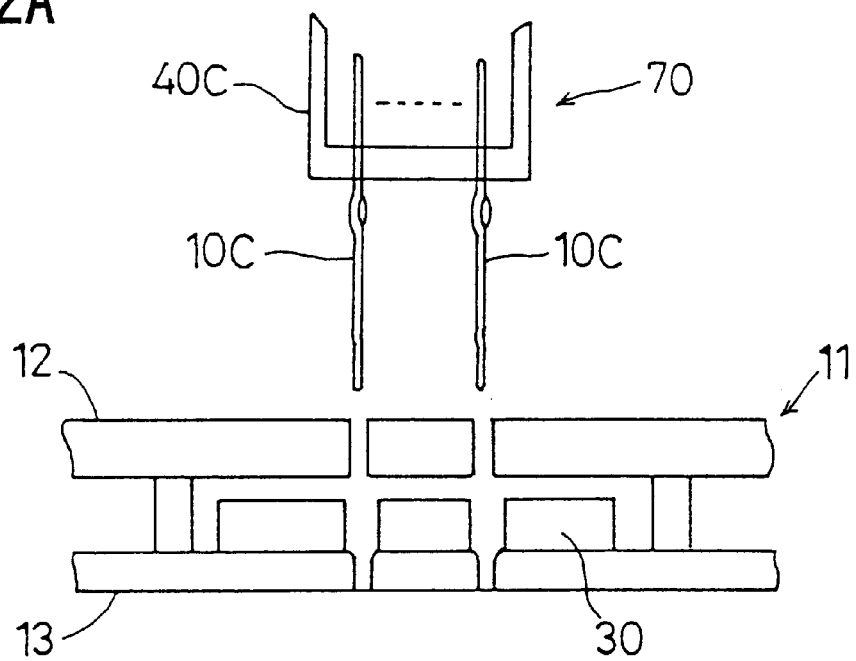
FIGS. 12A and 12B are diagrams of the connector and printed circuit board-connected structure according to a fourth embodiment of the present invention.
Figure 12B:
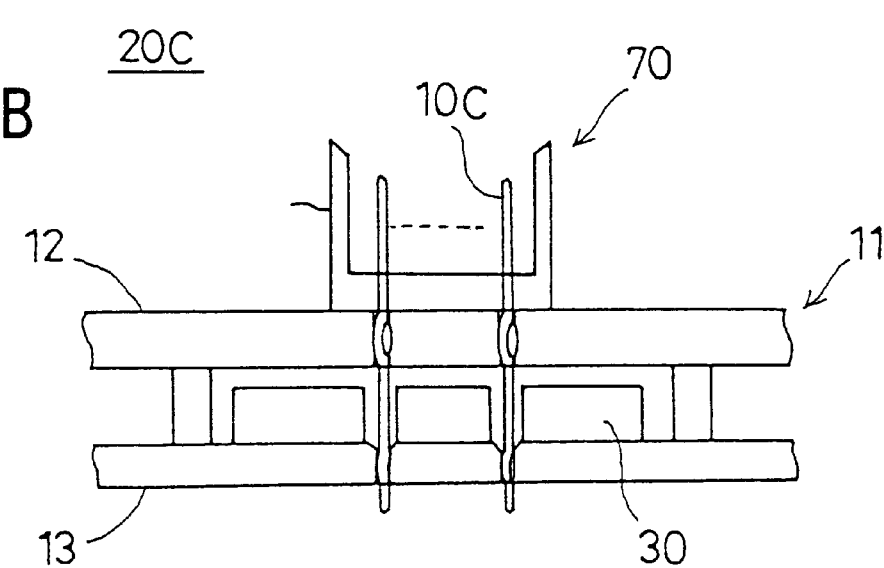
Figure 14:
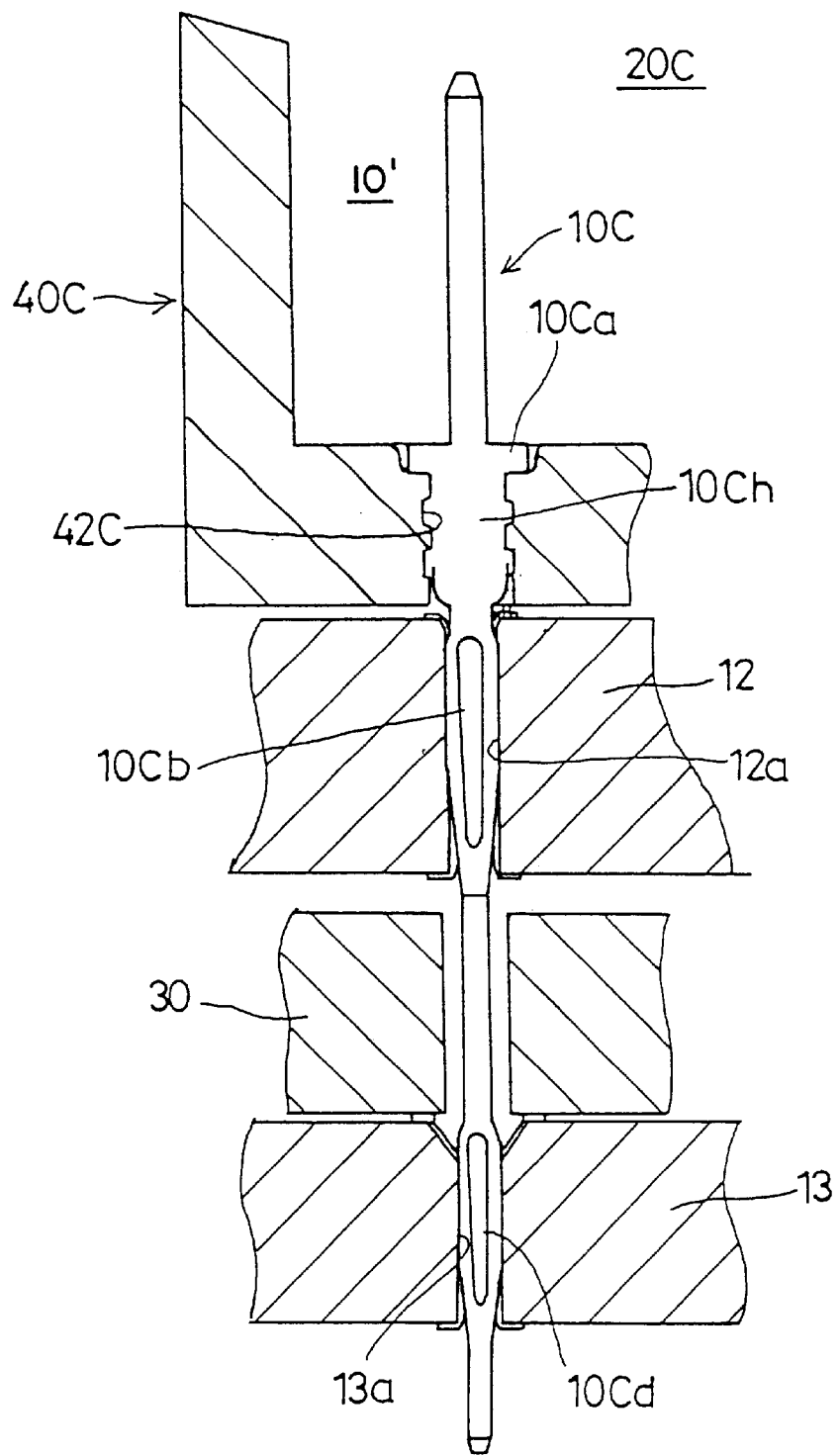
FIG. 14 is an expanded side cross-sectional view of a portion of the printed circuit board-connected structure shown in FIG. 12B.

FIGS. 12A and 12B show a connector 70 and a printed circuit board-connected structure 20C according to a fourth embodiment of the present invention. FIGS. 13A and 13B show expanded top and side cross-sectional views of a portion of the connector shown in FIG. 12A. As shown in FIGS. 13A and 13B, the connector 70 has a plurality of press-fit pins 10C pressed into the connector shroud 40C as well as a bend restraining member 30 as a separate component.

The press-fit pin 10C has a bulge section 10Ch in head 10; in place of the connector shroud engaging section 10Ag of the press-fit pin 10A shown in FIG. 7. This press-fit pin 10C is fixedly mounted on the connector shroud 40C in a state in which the bulge section 10Ch is inserted in the through-hole 42C of the bottom 41C of the connector shroud 40C, with the flange section 10Ca engaging the concavity 44C. The contact section 10Cg projects into the interior of the connector shroud 40C, with the first press-fit section 10Cb, the pin section 10Cc, the second press-fit section 10Cd and the tip section 10Ce projecting downward from the connector shroud 40C.

The bend restraining member 30 is mounted so that the bend restraining through-hole 31 engages the pin section 10Cc.

As shown in FIG. 12A, the above-described connector 70 is fixedly mounted on the printed circuit board assembly 11 with the insertion of each press-fit pin 10C into the top of the printed circuit board assembly 11 mounting a bend restraining member 30 by pressing the flange section 10C of each press-fit pin 10C so as to insert each press-fit pin 10C into the first through-hole 12a of the first printed circuit board 12, the bend restraining through-hole 31 of the bend restraining member 30 and the second through-hole 13a of the second printed circuit board 13, with the first press-fit section 10Ab inserted in the first through-hole 12a and the second press-fit section 10Ad inserted in the second through-hole. When the connector 70 is mounted on the printed circuit board assembly 11 as described above the printed circuit board-connected structure 20C is complete.

It should be noted that, as with the first embodiment described above, the first press-fit section 10Cb and the second press-fit section 10Cd enter the first through-hole 12a and the second through-hole 13a, respectively, at different times, thus requiring reduced pressing force for each press-fit pin 10C and, accordingly, leading to the insertion of a plurality of press-fit pins 10C simultaneously. Additionally, the press-fit pins 10C are less susceptible to bending because, first, the amount of force required to press the press-fit pins 10C into position is reduced and, second, a bend restraining member 30 is provided.

Figure 15:
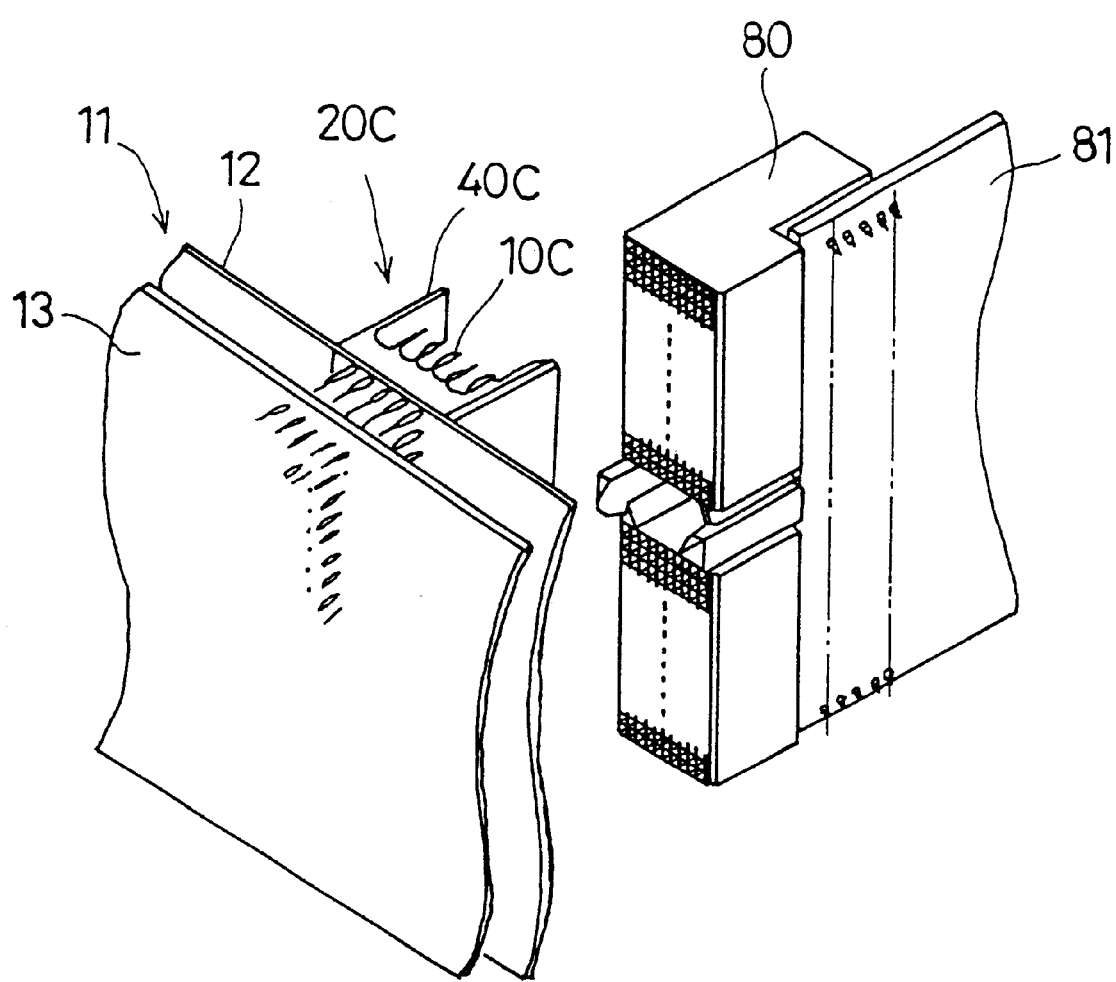
FIG. 15 is a diagram of the printed circuit board-connected structure in use.

As shown in FIG. 15, the printed circuit board-connected structure 20C is used to connect the connector 80 at the edge of the printed circuit board 81 to the connector 70.

A description will now be given of a fifth embodiment of the present invention.

Generally, if a bent press-fit pin 10C appears with the above-described connector 70 in a state in which the press-fit pins 10C have been inserted into position in the printed circuit board assembly 11, the bent press-fit pin 10C is extracted and another press-fit pin 10C is inserted in its place.

Figure 16:
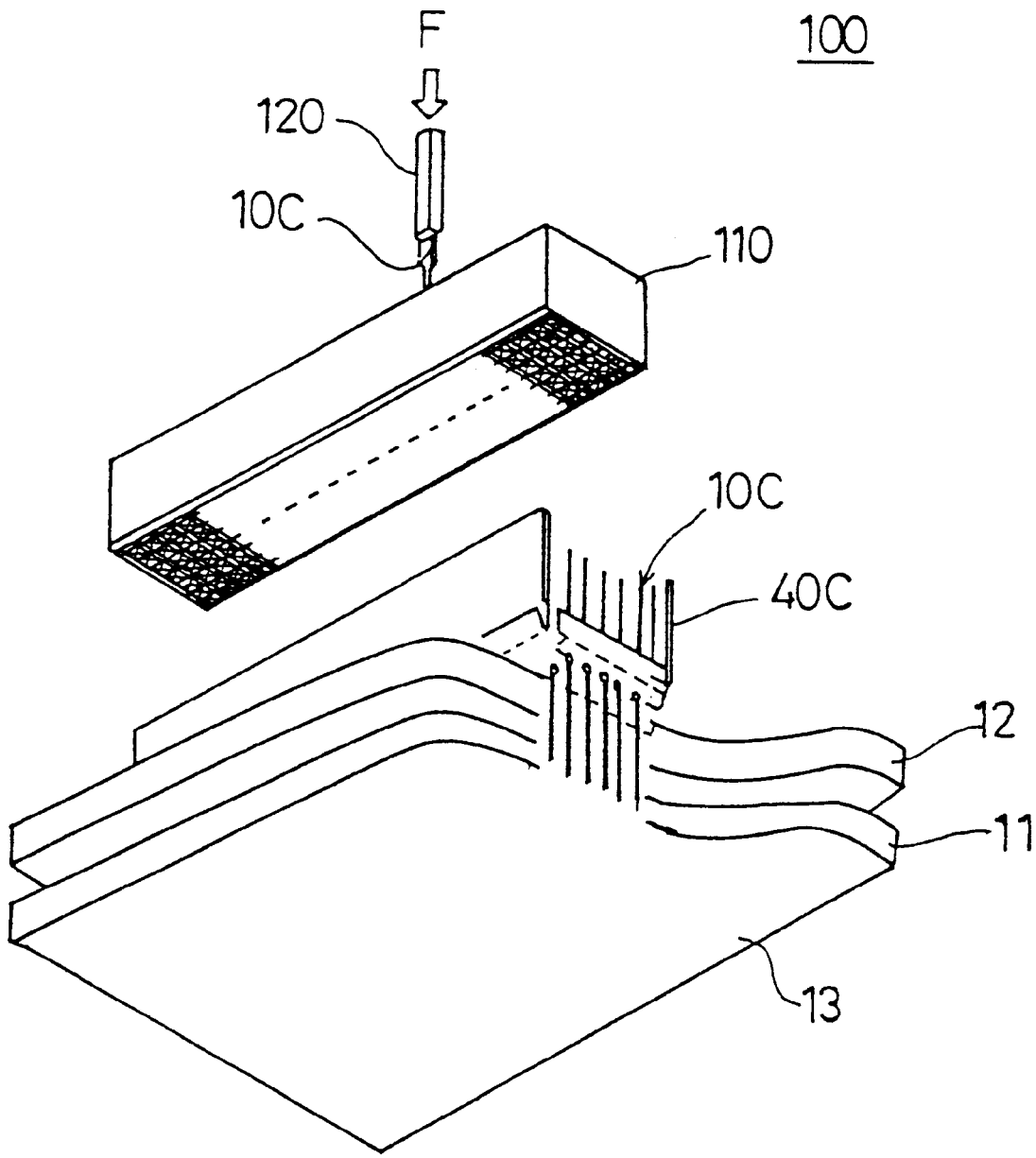
FIG. 16 is a diagram of the press-fit pin re-pressing jig according to a fifth embodiment of the present invention.

FIG. 16 is a diagram of a press-fit pin pressing jig 100 according to a fifth embodiment of the present invention, and FIG. 17A is a diagram showing the press-fit pin in a state in which it is pressed again into position.

The press-fit pin pressing jig 100 comprises a block 110 and a press punch 120, and is used, for example, to press into place a replacement press-fit pin 10C for a bent press-fit pin 10C.

The block 110 has a size corresponding to the size of the connector shroud 40C. A plurality of through-holes 111 are formed on the block in rows corresponding to the arrangement of the contact sections 10Cg. As shown in FIG. 17A, the through-holes 111, which are circular in cross-section, have a size capable of accommodating the press punch 120.

The press punch 120 is substantially cylindrical in shape. A hole 121 is formed in the center of the bottom edge of the press punch 120 so as to accommodate the contact section 10Cg.

The pressing of a press-fit pin 10C is carried out when, for whatever reason, a press-fit pin 10C is bent. Specifically, the replacement of a press-fit pin 10C involves removing the bent press-fit pin 10C, engaging and setting the block 110 on the connector shroud 40C, inserting the contact section 10Cg of the new press-fit pin 10C into the hole 121 on the press punch 120, inserting the press punch 120 together with the press-fit pin 10C into the through-hole 111 formed on the block 110 from above the block 110, applying a pressing force to the press punch 120, pressing the flange section 10C of the press-fit pin 10C and thus pressing the press-fit pin 10C into the printed circuit board assembly 11.

It should be noted that a through-hole 111a of a shape shown in FIG. 17C may be used instead of the through-hole 111 described above. Through-hole 111a has a concavity 111b that avoids the flange section 10Ca of the press-fit pin 10C. The press punch 120, too, is shaped so as to conform to the shape of this through-hole 111a.

It should be noted that the replacement of a press-fit pin 10 using the press jig 100 is as described above regardless of whether the printed circuit board-connected structure is the printed circuit board-connected structure 20 shown in FIG. 5D or the printed circuit board-connected structure 20A shown in FIG. 9B.

The above description is provided in order to enable any person skilled in the art to make and use the invention and sets forth the best mode contemplated by the inventors of carrying out their invention.

The present invention is not limited to the specifically disclosed embodiments, and variations and modifications may be made without departing from the scope of the present invention.

The present application is based on Japanese Priority Application No. 11-060263, filed on Mar. 3, 1999, the entire contents of which are hereby incorporated by reference.

What is claimed is:

1. A press-fit pin having an axis, comprising:

a head, a first axially elongated press-fit section, a central section, a second axially elongated press-fit section and a tip, integrally formed and disposed in axial alignment;

the first and second press-fit sections to be pressed for axial inserting movement into respective first and second axially aligned through-holes provided in corresponding first and second printed circuit boards; and the first press-fit section and the second press-fit section having respective central portions of respective maximum diameters, respective centers of the first and second central portions being separated by a first axial distance different from a second axial distance between respective centers of the first and second through-holes such that, as the press-fit pin is pressed for axial movement relatively to, and successive insertion of the first and second press-fit sections into, the first and second through-holes, the respective central portions of the first and second press-fit sections are inserted into the first and second through-holes, respectively, at different, successive times.

2. The press-fit pin as claimed in claim 1, wherein the first press-fit section and the second press-fit section are separated by an axial distance J between the center of the central portion of and the center portion of the second press-fit section, the axial distance J being shorter than an axial distance C separating the center of the first through-hole and the center of the second through-hole.

3. The press-fit pin as claimed in claim 1, wherein the first press-fit section and the second press-fit section are disposed so that a first boundary between the central portion and an adjacent tapered portion of the first press-fit section and a second boundary between the central portion and an adjacent tapered portion of the second press-fit section are separated by the distance J, wherein the distance J is shorter than the distance C separating the center of the first through-hole, in the direction of the thickness of the first printed circuit board, and the center of the second through-hole, in the direction of the thickness of the second printed circuit board.

4. The press-fit pin as claimed in claim 1, wherein the first press-fit section and the second press-fit section are disposed so that the first press-fit section enters the first through-hole of the first printed circuit board before the second press-fit section enters the second through-hole of the second printed circuit board.

5. The press-fit pin as claimed in claim 1, wherein the head of the press-fit pin adjacent an end of the first press-fit section remote from the second press-fit section, has a flat surface transverse to the axis so as to receive a pressing force exerted thereon.

6. The press-fit pin as claimed in claim 5, further comprising a contact section extending from the head in an axial direction opposite to the first press-fit section.

7. The press-fit pin as claimed in claim 6, wherein a lower side of the tip of the press-fit pin comprises further an obtuse angle section.

8. A press jig for pressing a press-fit pin, as recited in claim 1, into place, comprising:

a block and a press punch, the block having a size corresponding to a size of a connector shroud, a plurality of through-holes of a size capable of admitting the press punch, arranged on said block so as to correspond to press-fit pins previously pressed into position, and the press punch being substantially cylindrical in shape and having a hole formed in a center of a bottom of the press punch for accommodating a contact section of a top of a press-fit pin.

9. A press-fit pin as claimed in claim 1, wherein:

insertion of the press-fit pin into the first and second through-holes is completed when the respective central portions of the first and second press-fit sections are disposed within the respective first and second through-holes.

10. A press-fit pin as recited in claim 1, wherein the first central portion is of a first maximum diameter and the second central portion is of a second maximum diameter less than the first maximum diameter.

11. A press-fit pin as claimed in claim 1, wherein:

as the press-fit pin is moved axially for initial insertion into the first and second through-holes, the tip and the second press-fit section pass, in succession, axially through the first through-hole, the tip passing through the second through-hole and a portion of the second press-fit section adjacent the tip being received in the second through-hole as a first portion of the first press-fit section is received in the first through-hole.

12. A press-fit pin as claimed claim 1, wherein each of the first and second press-fit sections individually requires a respective insertion force having a profile which increases from a minimum value to a maximum peak value and diminishes thereafter, as the individual first and second press-fit sections are inserted throughout the axial length of each thereof into the corresponding first and second through-holes and the respective insertion force decreases to a value less than the peak value before the insertion is completed; and the first and second distances are selected so as to displace the respective peak values of the insertion forces to be non-coincident in time during insertion of the first and second press-fit sections into the respective first and second through-holes.

13. A connector comprising;

a connector shroud; and a press-fit pin penetrating the connector shroud, the press-fit pin having an axis and comprising a contact section, a flange section, a bulge section, a first axially elongated press-fit section and a second axially elongated press-fit section and a tip, integrally formed and disposed in axial alignment;

a connector shroud having a bottom, the bulge section being inserted into and fixedly mounted to the connector shroud bottom, the contact section projecting into the interior or the connector shroud; and the first press-fit section and the second press-fit section having respective central portions of respective maximum diameters, respective centers of the first and second central portions being separated by a first axial distance different from a second axial distance between respective centers of the first and second through-holes such that, as the press-fit pin is pressed for axial movement relatively to, and successive insertion of the first and second press-fit section into, the first and second through-holes, the respective central portions of the first and second press-fit sections are inserted into the first and second through-holes, respectively, at different, successive times.

14. The connector as claimed in claim 13, further comprising a bend restraining member having a bend retraining through-hole engaging a portion of the press-fit pin projecting below the bottom of the connector shroud and intermediate the first and second press-fit sections.

15. A connector comprising a press-fit pin as claimed in claim 13, wherein:
   insertion of the press-fit pin into the first and second through-holes is completed when the respective central portions of the first and second press-fit sections are disposed within the respective first and second through-holes.

16. A connector comprising a press-fit pin as recited in claim 13, wherein the first central portion is of a first maximum diameter and the second central portion is of a second maximum diameter less than the first maximum diameter.

17. A connector comprising a press-fit pin as claimed in claim 13, wherein:
   as the press-fit pin is moved axially for initial insertion into the first and second through-holes, the tip and the second press-fit section pass, in succession, axially through the first through-hole, the tip passing through the second through-hole and a portion of the second press-fit section adjacent the tip being received in the second through-hole as a first portion of the first press-fit section is received in the first through-hole.

18. A connector comprising a press-fit pin as claimed claim 13, wherein
   each of the first and second press-fit sections individually requires a respective insertion force having a profile which increases from a minimum value to a maximum peak value and diminishes thereafter, as the individual first and second press-fit sections are inserted throughout the axial length of each thereof into the corresponding first and second through-holes and the respective insertion force decreases to a value less than the peak value before the insertion is completed; and
   the first and second distances are selected so as to displace the respective peak values of the insertion forces to be non-coincident in time during insertion of the first and second press-fit sections into the respective first and second through-holes.

19. A printed circuit board-connected structure comprising:
   a first printed circuit board having a first through-hole;
   a second printed circuit board having a second through-hole and disposed so as to be separated from the first printed circuit board by a first distance;
   a connector shroud provided on the first printed circuit board;
   a press-fit pin having an axis and comprising a contact section, a flange section, a first axially elongated press-fit section and a second axially elongated press-fit section, the first press-fit section and the second press-fit section penetrating the connector shroud, the first press-fit section being inserted into the first through-hole, the second press-fit section being inserted into the second through-hole, the contact section projecting into the interior of the connector shroud, the first press-fit section and the second press-fit section projecting beyond a bottom of the connector shroud, and the first press-fit section and the second press-fit section having respective central portions of respective maximum diameters, respective centers of the first and second central portions being separated by a first axial distance different from a second axial distance between respective centers of the first and second through-holes such that, as the press-fit pin is pressed for axial movement relatively to, and successive insertion of the first and second press-fit sections into, the first and second through-holes, the respective central portions of the first and second press-fit sections are inserted into the first and second through-holes, respectively, at different, successive times.

20. The printed circuit board-connected structure as claimed in claim 19, further comprising a bend restraining member disposed between the first printed circuit board and the second printed circuit board, the bend restraining member having a bend restraining through-hole receiving therethrough a portion of the press-fit pin projecting below the bottom of the connector shroud.

21. The printed circuit board-connected structure as claimed in claim 19, wherein the second through-hole of the second printed circuit board has an inwardly tapered section extending from the upper surface of the second printed circuit board to an interior of the second through-hole of the second printed circuit board.

22. A printed circuit board having a press-fit pin as claimed in claim 19, wherein:
   insertion of the press-fit pin into the first and second through-holes is completed when the respective central portions of the first and second press-fit sections are disposed within the respective first and second through-holes.

23. A printed circuit board having a press-fit pin as recited in claim 19, wherein the first central portion is of a first maximum diameter and the second central portion is of a second maximum diameter less than the first maximum diameter.

24. A printed circuit board having a press-fit pin as claimed in claim 19, wherein:
   as the press-fit pin is moved axially for initial insertion into the first and second through-holes, the tip and the second press-fit section pass, in succession, axially through the first through-hole, the tip passing through the second through-hole and a portion of the second press-fit section adjacent the tip being received in the second through-hole as a first portion of the first press-fit section is received in the first through-hole.

25. A printed circuit board having a press-fit pin as claimed claim 19, wherein
   each of the first and second press-fit sections individually requires a respective insertion force having a profile which increases from a minimum value to a maximum peak value and diminishes thereafter, as the individual first and second press-fit sections are inserted throughout the axial length of each thereof into the corresponding first and second through-holes and the respective insertion force decreases to a value less than the peak value before the insertion is completed; and
   the first and second distances are selected so as to displace the respective peak values of the insertion forces to be non-coincident in time during insertion of the first and second press-fit sections into the respective first and second through-holes.

26. A connector extending through aligned, first and second through-holes of respective, first and second spaced boards, comprising:

a connector shroud; and a press-fit pin penetrating the connector shroud, the press-fit pin having a head, a contact section, a flange section, a shroud engaging section, a first axially elongated press-fit section and a second axially elongated press-fit section, the first and second press-fit sections being insertable through a through-hole in a connector shroud bottom wall and the shroud engaging section being insertable into the through-hole and fixedly engaging the connector shroud bottom wall with the contact section projecting into the interior of the connector shroud, the first press-fit section and the second press-fit section projecting beyond the bottom wall of the connector shroud; and the first press-fit section and the second press-fit section having respective central portions of respective maximum diameters, respective centers of the first and second central portions being separated by a first axial distance different from a second axial distance between respective centers of the first and second through-holes such that, as the press-fit pin is pressed for axial movement relatively to, and successive insertion of the first and second press-fit sections into, the first and second through-holes, the respective central portions of the first and second press-fit sections are inserted into the first and second through-holes, respectively, at different, successive times.

27. The connector as claimed in claim 26, further comprising a bend restraining member disposed between the first and second boards and having a bend restraining through-hole aligned with the first and second through-holes and engaging a portion of the press-fit pin projecting below the bottom of the connector shroud.

28. The press-fit pin of claim 26, wherein the spacing of the respective, fixed maximum dimension central portions of the first and second press-fit sections are spaced axially, relatively to each other and to the spacing of the respective, first and second through-holes of the first and second boards, so that a maximum force required for insertion of the second press-fit section through the second through-hole occurs in advance of the maximum force required for insertion of the first press-fit section through the first through-hole.

29. A printed circuit board having a press-fit pin as claimed in claim 26, wherein:

insertion of the press-fit pin into the first and second through-holes is completed when the respective central portions of the first and second press-fit sections are disposed within the respective first and second through-holes.

30. A printed circuit board having a press-fit pin as recited in claim 26, wherein the first central portion is of a first maximum diameter and the second central portion is of a second maximum diameter less than the first maximum diameter.

31. A printed circuit board having a press-fit pin as claimed in claim 26, wherein:

as the press-fit pin is moved axially for initial insertion into the first and second through-holes, the tip and the second press-fit section pass, in succession, axially through the first through-hole, the tip passing through the second through-hole and a portion of the second press-fit section adjacent the tip being received in the second through-hole as a first portion of the first press-fit section is received in the first through-hole.

32. A printed circuit board having a press-fit pin as claimed claim 26, wherein each of the first and second press-fit sections individually requires a respective insertion force having a profile which increases from a minimum value to a maximum peak value and diminishes thereafter, as the individual first and second press-fit sections are inserted throughout the axial length of each thereof into the corresponding first and second through-holes and the respective insertion force decreases to a value less than the peak value before the insertion is completed; and the first and second distances are selected so as to displace the respective peak values of the insertion forces to be non-coincident in time during insertion of the first and second press-fit sections into the respective first and second through-holes.

33. A press-fit pin insertable through aligned, first and second through-holes of first and second parallel boards spaced apart by a first distance, the press-fit pin comprising:

a head, a first axially elongated press-fit section, a central section, a second press-fit section and a pin integrally formed and disposed in axial alignment;

the first and second press-fit sections each having an axially extending depression therein bounded by a pair of longitudinal ribs spaced by respective, fixed maximum dimensions, transverse to the axis, along respective central sections thereof and the ribs tapering inwardly from opposite ends of the central portion of the depression to opposite ends of the depression, the fixed, maximum dimension of the depression of the first press-fit section being greater than the fixed, maximum dimension of the depression of the second press-fit section and respectively being selected, relatively to respective first and second diameters of the first and second through-holes, to provide secure engagement thereof when the central portions of the first and second press-fit section are respectively inserted fully into the respective first and second through-holes; and the first press-fit section and the second press-fit section having respective central portions of respective maximum diameters, respective centers of the first and second central portions being separated by a first axial distance different from a second axial distance between respective centers of the first and second through-holes such that, as the press-fit pin is pressed for axial movement relatively to, and successive insertion of the first and second press-fit sections into, the first and second through-holes, the respective central portions of the first and second press-fit sections are inserted into the first and second through-holes, respectively, at different, successive times.

34. The press-fit pin of claim 33, wherein the head further comprises a connector shroud engaging section, receivable through an aperture in a connector shroud bottom wall and securing the connector shroud to the first and second boards.

35. The press-fit pin of claim 34, wherein the connector shroud engaging section further comprises a flange extending transversely of the axial direction and received in and engaging a corresponding recess in a surface of the wall of the connector shroud bottom plate remote from the first and second boards.

36. The press-fit pin of claim 35, wherein the head further comprises an elongated contact section extending axially from the connector shroud engaging section.

37. A press-fit pin as claimed in claim 33, wherein:

insertion of the press-fit pin into the first and second through-holes is completed when the respective central portions of the first and second press-fit sections are disposed within the respective first and second through-holes.

38. A press-fit pin as recited in claim 33, wherein the first central portion is of a first maximum diameter and the second central portion is of a second maximum diameter less than the first maximum diameter.

39. A press-fit pin as claimed in claim 33, wherein:

as the press-fit pin is moved axially for initial insertion into the first and second through-holes, the tip and the second press-fit section pass, in succession, axially through the first through-hole, the tip passing through the second through-hole and a portion of the second press-fit section adjacent the tip being received in the second through-hole as a first portion of the first press-fit section is received in the first through-hole.

40. A press-fit pin as claimed claim 33, wherein each of the first and second press-fit sections individually requires a respective insertion force having a profile which increases from a minimum value to a maximum peak value and diminishes thereafter, as the individual first and second press-fit sections are inserted throughout the axial length of each thereof into the corresponding first and second through-holes and the respective insertion force decreases to a value less than the peak value before the insertion is completed; and the first and second distances are selected so as to displace the respective peak values of the insertion forces to be non-coincident in time during insertion of the first and second press-fit sections into the respective first and second through-holes.

* * * * *

UNITED STATES PATENT AND TRADEMARK OFFICE
CERTIFICATE OF CORRECTION

PATENT NO. : 6,305,949 B1
DATED : October 23, 2001
INVENTOR(S) : Takeshi Okuyama et al.

It is certified that error appears in the above-identified patent and that said Letters Patent is hereby corrected as shown below:

Column 14,
Lines 51-52, change "enlongated" to -- elongated --.
Line 31, after "claimed" insert -- in --.

Column 18,
Line 2, after "claimed" insert -- in --.

Column 20,
Line 1, after "claimed" insert -- in --.

Signed and Sealed this

Thirtieth Day of April, 2002

Attest:

JAMES E. ROGAN
*Director of the United States Patent and Trademark Office*

*Attesting Officer*